(12) United States Patent
Yoon

(10) Patent No.: US 11,942,544 B2
(45) Date of Patent: Mar. 26, 2024

(54) SEMICONDUCTOR DEVICE INCLUDING TRANSISTOR INCLUDING HORIZONTAL GATE STRUCTURE AND VERTICAL CHANNEL LAYER AND METHOD FOR FABRICATING THE SAME

(71) Applicant: SK hynix Inc., Gyeonggi-do (KR)

(72) Inventor: Young Gwang Yoon, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 184 days.

(21) Appl. No.: 17/481,479

(22) Filed: Sep. 22, 2021

(65) Prior Publication Data
US 2022/0328687 A1 Oct. 13, 2022

(30) Foreign Application Priority Data
Apr. 7, 2021 (KR) .................. 10-2021-0045308

(51) Int. Cl.
*H01L 29/78* (2006.01)
*H01L 29/10* (2006.01)
*H01L 29/423* (2006.01)
*H01L 29/66* (2006.01)

(52) U.S. Cl.
CPC ...... *H01L 29/7827* (2013.01); *H01L 29/1033* (2013.01); *H01L 29/42364* (2013.01); *H01L 29/66666* (2013.01)

(58) Field of Classification Search
CPC ............. H01L 29/7827; H01L 29/1033; H01L 29/42364; H01L 29/66666; H01L 21/26586; H01L 29/78642; H01L 27/092; H01L 21/823807; H01L 21/823828; H01L 21/823857; H01L 29/1037; H01L 29/4236; H01L 21/823885; H01L 21/823475; H01L 21/823487; H01L 21/823871; H01L 29/41741; H01L 29/42376
USPC ....................................................... 257/329
See application file for complete search history.

(56) References Cited

U.S. PATENT DOCUMENTS

| 6,461,900 | B1 | 10/2002 | Sundaresan et al. |
| 10,115,814 | B2 | 10/2018 | Ding et al. |
| 2014/0008714 | A1* | 1/2014 | Makala ............. H10B 41/20 257/E27.06 |

* cited by examiner

*Primary Examiner* — Mohammad M Hoque
(74) *Attorney, Agent, or Firm* — IP & T GROUP LLP

(57) ABSTRACT

A semiconductor device includes: a first stacked structure including a first lower dielectric layer, a first horizontal gate structure, and a first upper dielectric layer stacked vertically; a second stacked structure including a second lower dielectric layer, a second horizontal gate structure, and a second upper dielectric layer stacked vertically, and having a first side facing a first side of the first stacked structure; a first channel layer formed on the first side of the first stacked structure; a second channel layer formed on the first side of the second stacked structure; a lower electrode layer commonly coupled to lower ends of the first and second channel layers between the first and second stacked structures; a first upper electrode layer coupled to an upper end of the first channel layer; and a second upper electrode layer coupled to an upper end of the second channel layer.

20 Claims, 20 Drawing Sheets

SEMICONDUCTOR DEVICE INCLUDING TRANSISTOR INCLUDING HORIZONTAL GATE STRUCTURE AND VERTICAL CHANNEL LAYER AND METHOD FOR FABRICATING THE SAME

CROSS-REFERENCE TO RELATED APPLICATIONS

The present application claims priority of Korean Patent Application No. 10-2021-0045308, filed on Apr. 7, 2021, which is incorporated herein by reference in its entirety.

BACKGROUND

1. Field

Various embodiments of the present invention disclosure relate to a semiconductor technology and, more particularly, to a semiconductor device including a transistor, and a method for fabricating the semiconductor device.

2. Description of the Related Art

Advances in the electronic industry require electronic products which are increasingly miniaturized, more highly integrated and exhibit higher performance and operation speed.

In order to satisfy these demands, it is required to develop new technologies capable of maintaining and/or improving the characteristics of the unit elements which form the electronic products, such as transistors, capacitors and the like, while reducing the size of the unit elements.

SUMMARY

Various embodiments of the present invention disclosure are directed to a reduced size semiconductor device which exhibits reduced parasitic capacitance and improved operation characteristics. Other embodiments of the present invention disclosure are directed to a method for fabricating the semiconductor device.

In accordance with an embodiment of the present invention disclosure, a semiconductor device includes: a first stacked structure including a first lower dielectric layer, a first horizontal gate structure, and a first upper dielectric layer that are stacked in a vertical direction; a second stacked structure including a second lower dielectric layer, a second horizontal gate structure, and a second upper dielectric layer that are stacked in the vertical direction, and having a first side which faces a first side of the first stacked structure; a first channel layer formed on the first side of the first stacked structure; a second channel layer formed on the first side of the second stacked structure; a lower electrode layer commonly coupled to lower ends of the first and second channel layers between the first stacked structure and the second stacked structure; a first upper electrode layer coupled to an upper end of the first channel layer; and a second upper electrode layer coupled to an upper end of the second channel layer.

In accordance with another embodiment of the present invention disclosure, a method for fabricating a semiconductor device includes: forming a first initial stacked structure including a first lower dielectric layer, a first sacrificial layer, and a first upper dielectric layer that are stacked over a substrate in a vertical direction; forming a second initial stacked structure including a second lower dielectric layer, a second sacrificial layer, and a second upper dielectric layer that are stacked over the substrate in the vertical direction and having a first side which faces a first side of the first initial stacked structure; forming a lower electrode layer whose upper surface is positioned at a height equal to or lower than upper surfaces of the first and second lower dielectric layers while filling a lower space between the first initial stacked structure and the second initial stacked structure over the substrate; forming a first channel layer and a second channel layer having lower ends coupled to the lower electrode layer on the first side of the first initial stacked structure and the first side of the second initial stacked structure, respectively; forming a first upper electrode layer and a second upper electrode layer respectively coupled to an upper end of the first channel layer and an upper end of the second channel layer; and replacing the first sacrificial layer and the second sacrificial layer with a first horizontal gate structure and a second horizontal gate structure, respectively.

These and other features and advantages of the present invention disclosure will become better understood by the those having ordinary skill in the art of the invention from the following detailed description and drawings of specific embodiments.

DETAILED DESCRIPTION

Figure 1A:
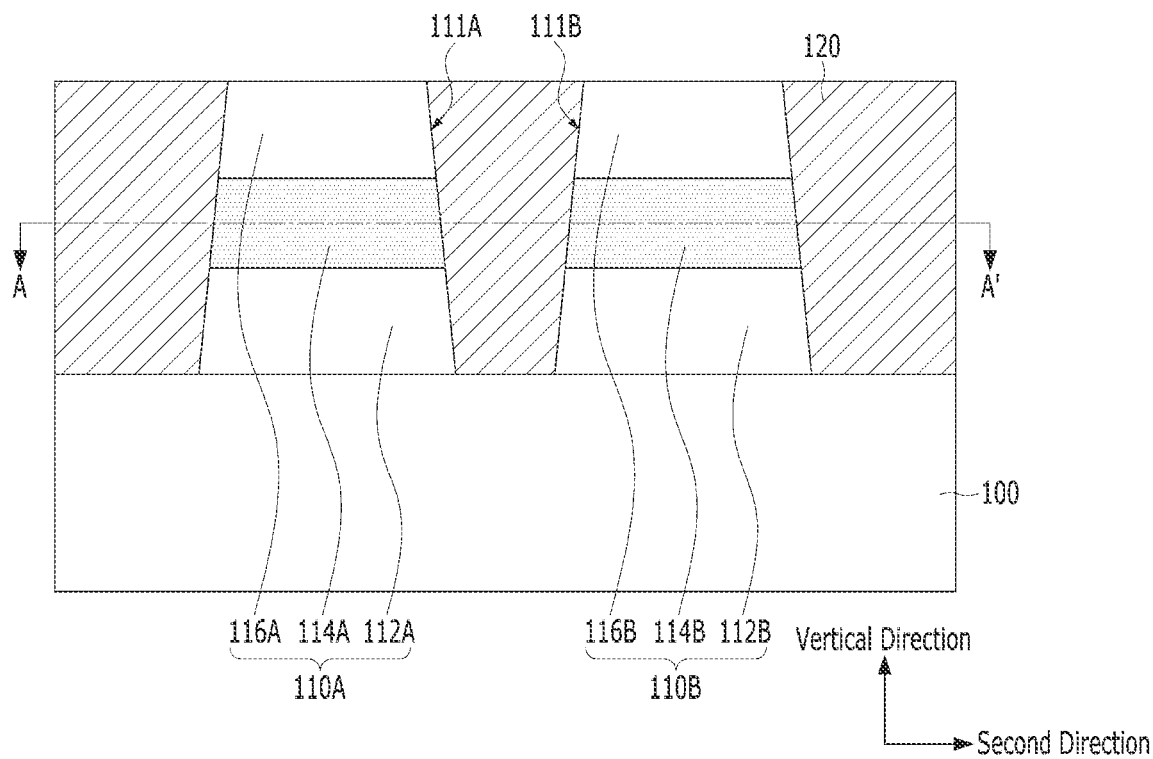
FIGS. 1A to 14B illustrate a semiconductor device and a method for fabricating the semiconductor device in accordance with an embodiment of the present invention disclosure.

Various embodiments of the present invention disclosure will be described below in more detail with reference to the accompanying drawings. The present invention disclosure may, however, be embodied in different forms and should not be construed as limited to the embodiments set forth herein. Rather, these embodiments are provided so that this disclosure will be thorough and complete, and will fully convey the scope of the present invention disclosure to those skilled in the art. Throughout the disclosure, like reference numerals refer to like parts throughout the various figures and embodiments of the present invention disclosure.

It will be understood that when an element is referred to as being "coupled" or "connected" to another element, it may mean that the two are directly coupled or electrically connected to each other with another circuit intervening therebetween. Other expressions that explain the relationship between elements, such as "between", "directly between", "adjacent to" or "directly adjacent to" should be construed in the same way.

The terms an upper end and a lower end of an element as used herein may include an upper and a lower part or portion of the element.

Hereinafter, the diverse embodiments of the present invention disclosure will be described in detail with reference to the attached drawings.

The drawings are not necessarily to scale and in some instances, proportions may have been exaggerated in order to clearly illustrate certain features of the embodiments. When a first layer is referred to as being 'on' a second layer or 'on' a substrate, it not only refers to a case where the first layer is formed directly on the second layer or the substrate but also a case where a third layer exists between the first layer and the second layer or the substrate.

FIGS. 1A to 14B illustrate a semiconductor device and a method for fabricating the semiconductor device in accordance with an embodiment of the present invention disclosure. Figures denoted as 1A, 2A, etc. are cross-sectional views taken along a line B-B' of corresponding figures denoted as 1B, 2B, etc. FIGS. 1B, 2B, etc. are plan views illustrated at the height of a line A-A' of corresponding figures denoted as 1A, 2A, etc. The semiconductor device of this embodiment may include a CMOS transistor having an NMOS transistor and/or a PMOS transistor.

First, a method for fabricating a semiconductor device in accordance with an embodiment of the present invention disclosure is described.

Figure 1B:
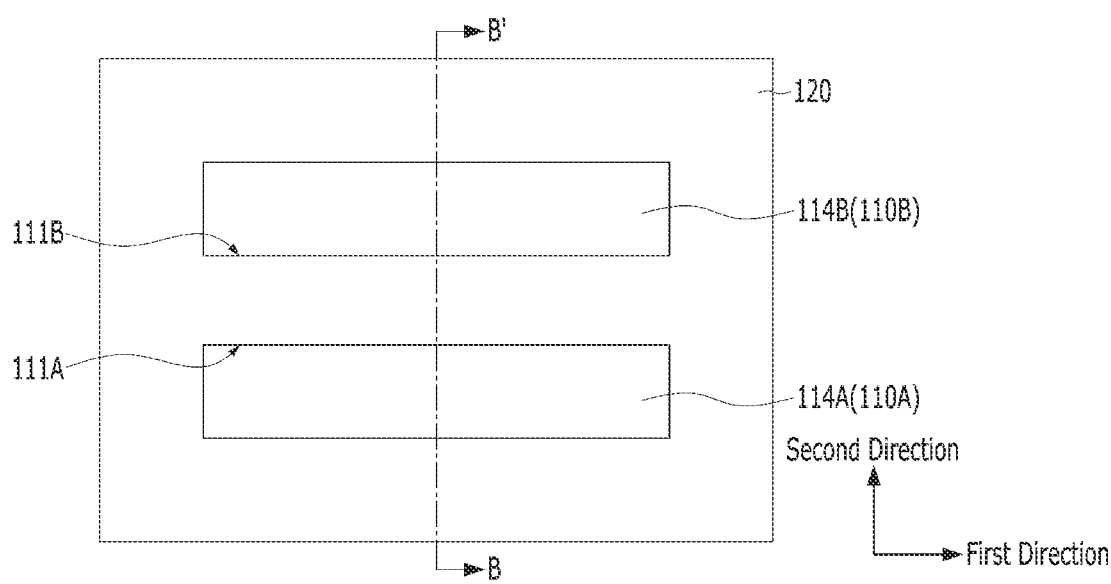

Referring to FIGS. 1A and 1B, a substrate 100 may be provided. The substrate 100 may include a semiconductor material, such as, for example, silicon.

Subsequently, a first initial stacked structure 110A and a second initial stacked structure 110B may be formed over the substrate 100. Each of the first and second initial stacked structures 110A and 110B may have a rectangular shape from the perspective of a plan view. For example, each of the first initial stacked structure 110A and the second initial stacked structure 110B may have a bar shape in which a side length in a first direction is longer than a side length in a second direction.

The first and second directions may be orthogonal to each other and may define a plane perpendicular to the direction of stacking which is referred to also as a vertical or a third direction. Also, the first and second initial stacked structures 110A and 110B may be disposed to be spaced apart from each other in the second direction so that one side 111A in the second direction of the first initial stacked structure 110A and one side 111B in the second direction of the second initial stacked structure 110B face each other from the perspective of a plan view. The one side 111A of the first initial stacked structure 110A and the one side 111B of the second initial stacked structure 110B facing each other may be inclined.

The first initial stacked structure 110A may include a first lower dielectric layer 112A, a first sacrificial layer 114A, and a first upper dielectric layer 116A that are stacked in the vertical direction. The second initial stacked structure 110B may include a second lower dielectric layer 112B, a second sacrificial layer 114B, and a second upper dielectric layer 116B that are stacked in the vertical direction. Here, the first and second sacrificial layers 114A and 114B may serve to provide a space in which first and second gate electrode layers, which will be described later, are to be formed. The first and second lower dielectric layers 112A and 112B may serve to electrically disconnect the first and second gate electrode layers from the substrate 100 and a lower electrode layer, which will be described later. The first and second upper dielectric layers 116A and 116B may serve to electrically disconnect the first and second gate electrode layers from the first and second upper electrode layers, which will be described later.

The first and second initial stacked structures 110A and 110B may be formed by sequentially depositing a dielectric material for forming the first and second lower dielectric layers 112A and 112B, a sacrificial material for forming the first and second sacrificial layers 114A and 114B, and a dielectric material for forming the first and second upper dielectric layers 116A and 116B over the substrate 100, and then selectively etching them. Since the first and second sacrificial layers 114A and 114B are replaced by the first and second gate electrode layers in a subsequent process, the first and second sacrificial layers 114A and 114B may be formed of a material whose etch rate is different from those of the first and second lower dielectric layers 112A and 112B and the first and second upper dielectric layers 116A and 116B. For example, the first and second sacrificial layers 114A and 114B may include SiON (silicon oxynitride) or SiN (silicon nitride), and the first and second lower dielectric layers 112A and 112B and the first and second upper dielectric layers 116A and 116B may include SiCN (silicon carbon nitride), SiBCN (silicon boron carbon nitride), or SiCO (silicon carbon oxide).

Subsequently, a conductive layer 120 may be formed over the substrate 100 to fill the remaining spaces except for the first and second initial stacked structures 110A and 110B. The conductive layer 120 may be used for forming a common electrode of an NMOS transistor and a PMOS transistor, for example, a lower electrode layer that functions as a common source electrode. The conductive layer 120 may be formed by depositing a conductive material having a thickness sufficient to cover the first and second initial stacked structures 110A and 110B while filling the space between the first and second initial stacked structures 110A and 110B over the substrate 100, and performing a planarization process, for example, a Chemical Mechanical Polishing (CMP) process, until the upper surfaces of the first and second initial stacked structures 110A and 110B are exposed. The conductive layer 120 may include diverse conductive materials, for example, a metal such as platinum (Pt), tungsten (W), aluminum (Al), copper (Cu), tantalum (Ta), titanium (Ti), ruthenium (Ru), molybdenum (Mo) and the like, a compound of the metal, or an alloy of the metal.

Figure 2A:
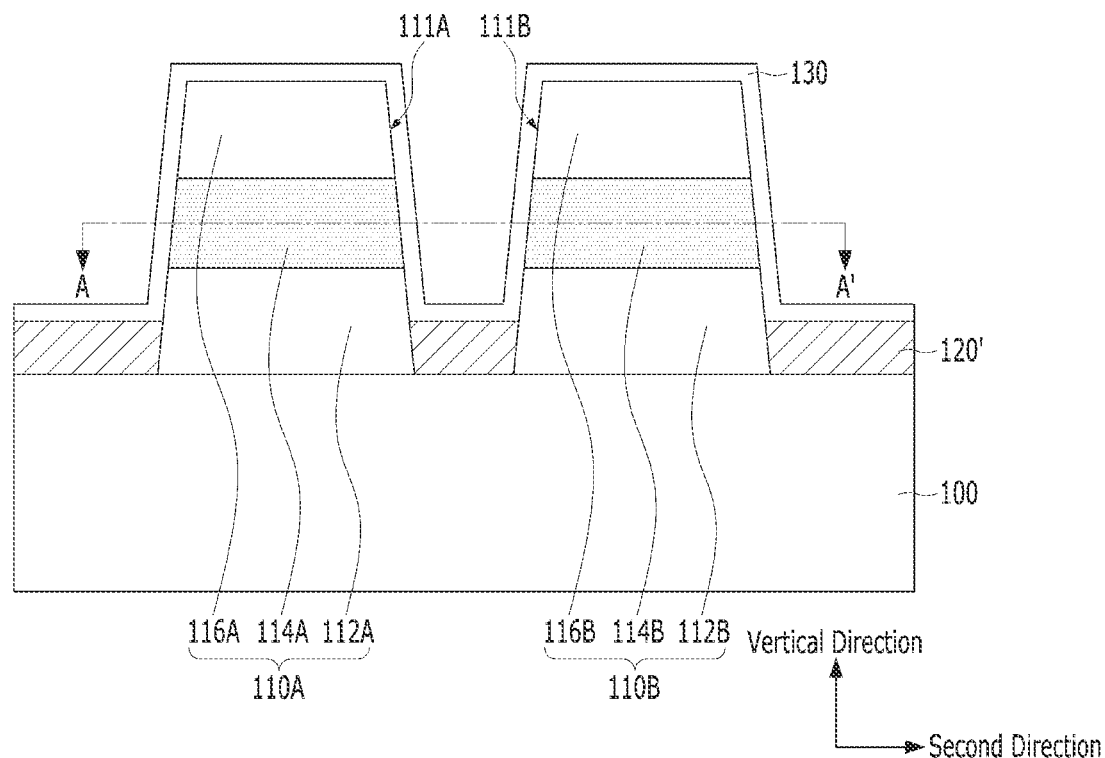
Figure 2B:
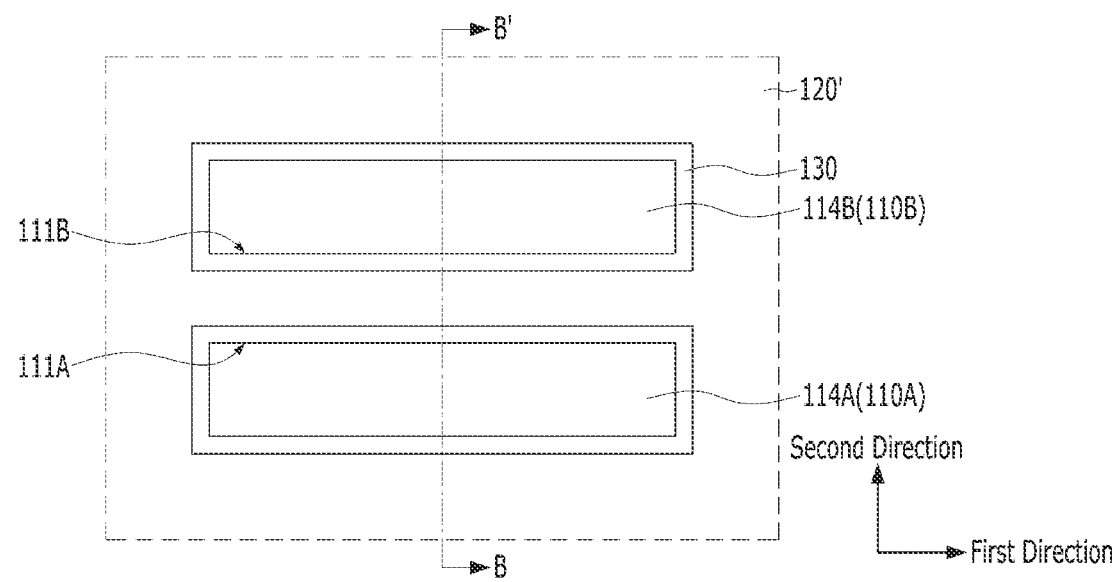

Referring to FIGS. 2A and 2B, a conductive layer pattern 120' may be formed by removing a portion of the conductive layer 120 through an etch-back process or the like. In the vertical direction, the upper surface of the conductive layer pattern 120' may be positioned at a height that is equal to or lower than the upper surfaces of the first and second lower dielectric layers 112A and 112B. For the sake of convenience in description, in the plan view of FIG. 2B, the shape of the conductive layer pattern 120', which is not seen at the height of the line A-A' of FIG. 2A, is illustrated by dotted lines.

Subsequently, over the conductive layer pattern 120' and the first and second initial stacked structures 110A and 110B, a material layer 130 may be formed along the lower profile, that is, the upper surface of the conductive layer pattern 120', the sides of the first and second initial stacked structures 110A and 110B protruding above the conductive layer pattern 120', and the upper surfaces of the first and second initial stacked structures 110A and 110B. The material layer 130 may be provided for forming a channel of an NMOS transistor and a PMOS transistor. The material layer 130 may be conformally formed to have a thin thickness that does not completely fill the space between the first initial stacked structure 110A and the second initial stacked structure 110B. That is, the material layer 130 may be in a form of a thin film. For example, the material layer 130 may include a semiconductor material that is not doped with an impurity. In an embodiment, the material layer 130 may be an undoped silicon thin film.

Figure 3A:
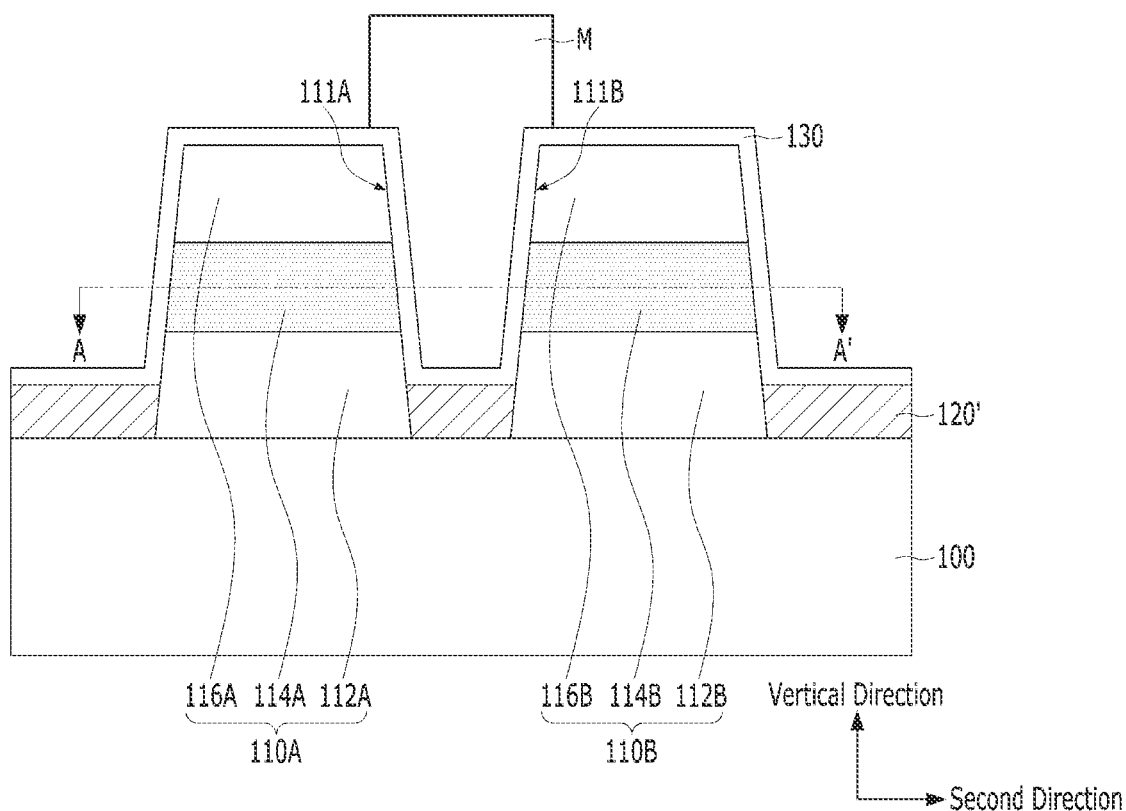
Figure 3B:
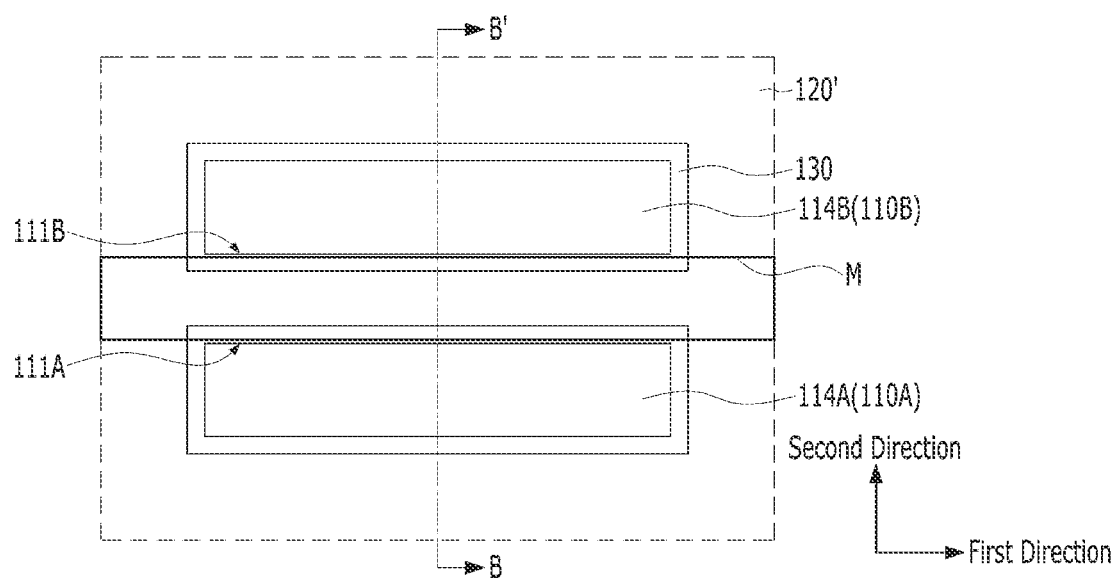

Referring to FIGS. 3A and 3B, a mask pattern M may be formed to extend in the first direction while overlapping with the space between the first initial stacked structure 110A and the second initial stacked structure 110B over the process result of FIGS. 2A and 2B. Accordingly, the mask pattern M may cover the conductive layer pattern 120' and the material layer 130 between the first initial stacked structure 110A and the second initial stacked structure 110B, and may expose the conductive layer pattern 120' and the material layer 130 in the other region. Furthermore, although not illustrated, the mask pattern M may further overlap with at least a portion of the upper surfaces of the first and second initial stacked structures 110A and 110B.

Figure 4A:
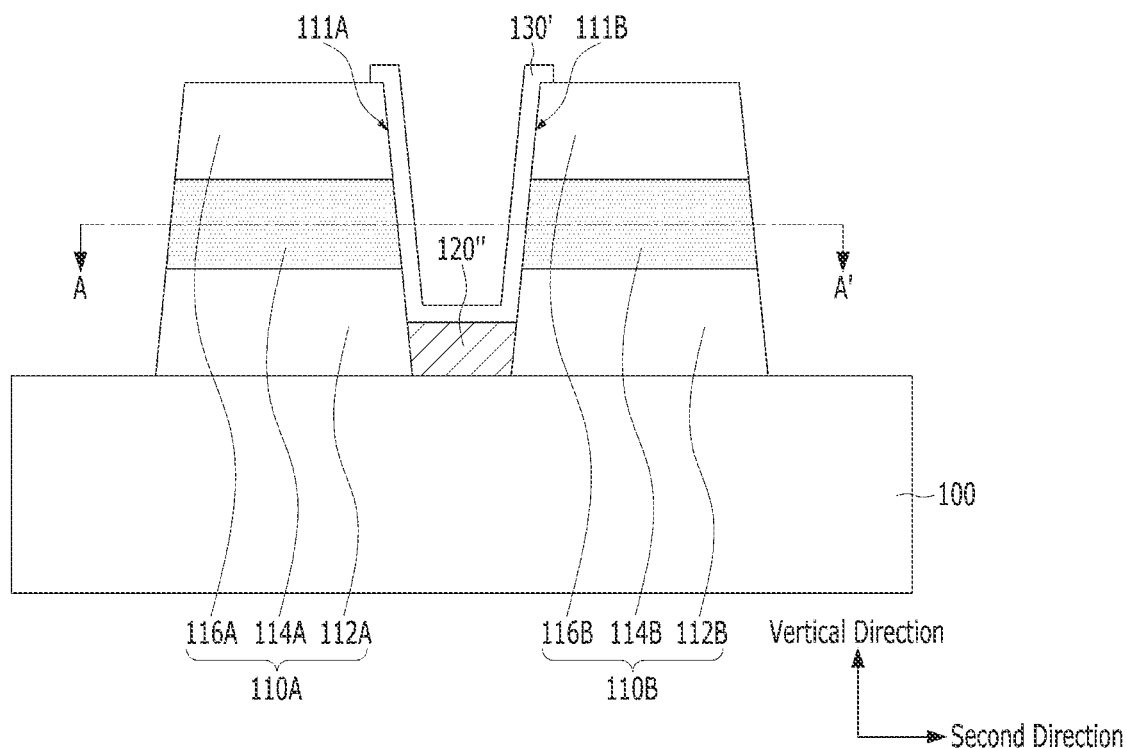
Figure 4B:
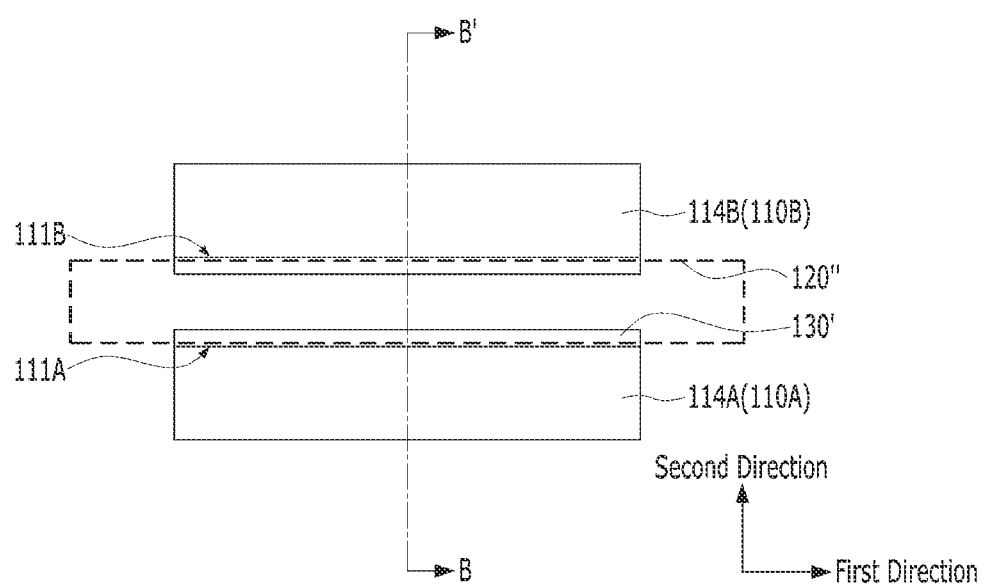

Referring to FIGS. 4A and 4B, a material layer pattern 130' and a lower electrode layer 120" may be formed by removing the material layer 130 and the conductive layer pattern 120' exposed by the mask pattern M by an etching method or the like.

The lower electrode layer 120" may have a line shape which is positioned below the material layer pattern 130' between the first initial stacked structure 110A and the second initial stacked structure 110B and extends in the first direction. For the sake of convenience in description, in the plan view of FIG. 4B, the shape of the lower electrode layer 120" that is not seen in the cross section taken at the height of the line A-A' of FIG. 4A is illustrated by a dotted line. As described above, the lower electrode layer 120" may function as a common electrode of the NMOS transistor and the PMOS transistor.

The material layer pattern 130' may be formed along the lower profile over one side 111A of the first initial stacked structure 110A, one side 111B of the second initial stacked structure 110B, and the upper surface of the lower electrode layer 120". Furthermore, although not illustrated, the material layer pattern 130' may further extend onto at least a portion of the upper surfaces of the first and second initial stacked structures 110A and 110B according to the shape of the above-described mask pattern M.

After the material layer pattern 130' and the lower electrode layer 120" are formed, the mask pattern M may be removed.

Figure 5A:
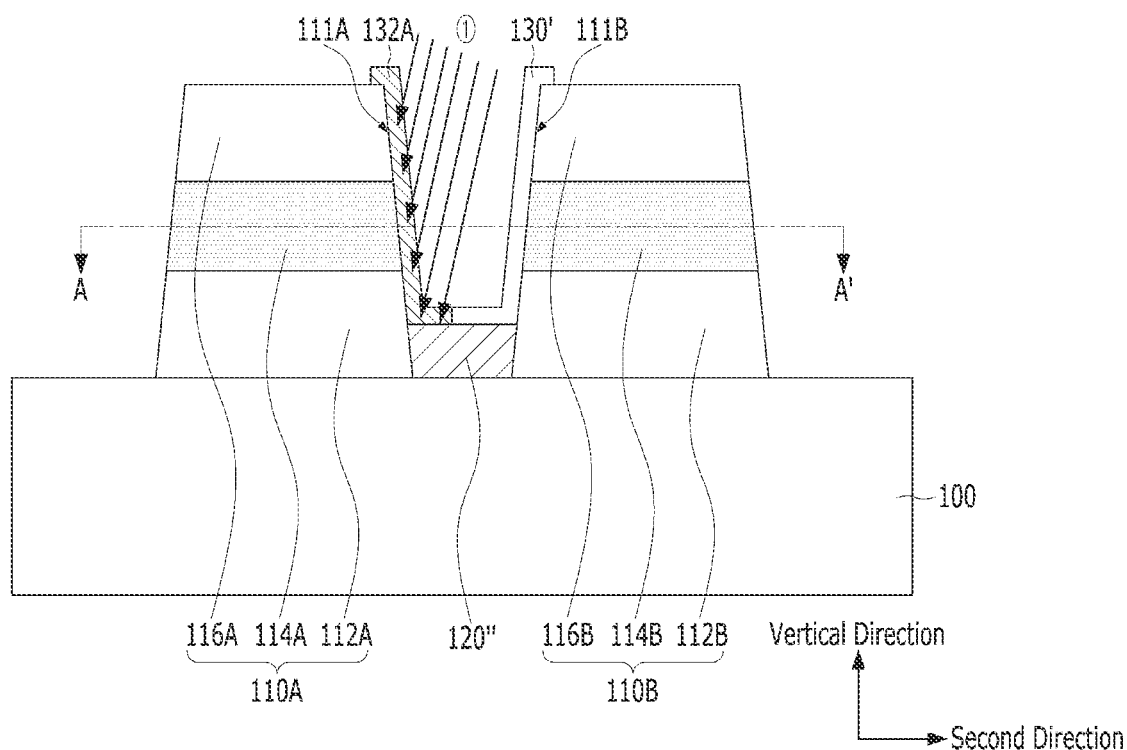
Figure 5B:
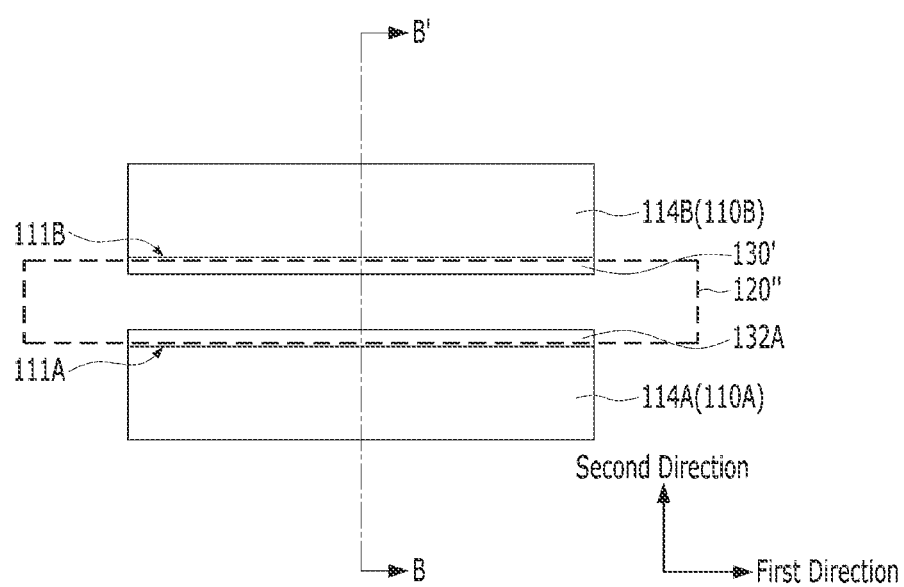

Referring to FIGS. 5A and 5B, a first doped layer 132A may be formed by doping an impurity of a first conductivity type onto the material layer pattern 130' on one side 111A of the first initial stacked structure 110A. For example, the first doped layer 132A may serve as a channel of an NMOS transistor, and to this end, a high-concentration N-type impurity may be doped.

The N-type impurity may be doped by a tilt implantation method slanting toward one side 111A of the first initial stacked structure 110A (see arrow ①). The angle of the tilt implantation may be adjusted in such a manner that the N-type impurity is doped onto the entire material layer pattern 130' on one side 111A of the first initial stacked structure 110A. In this case, since the N-type impurity is doped to the lowermost portion of the material layer pattern 130', the lower end of the first doped layer 132A may contact the lower electrode layer 120" to be electrically connected to the lower electrode layer 120".

Figure 6A:
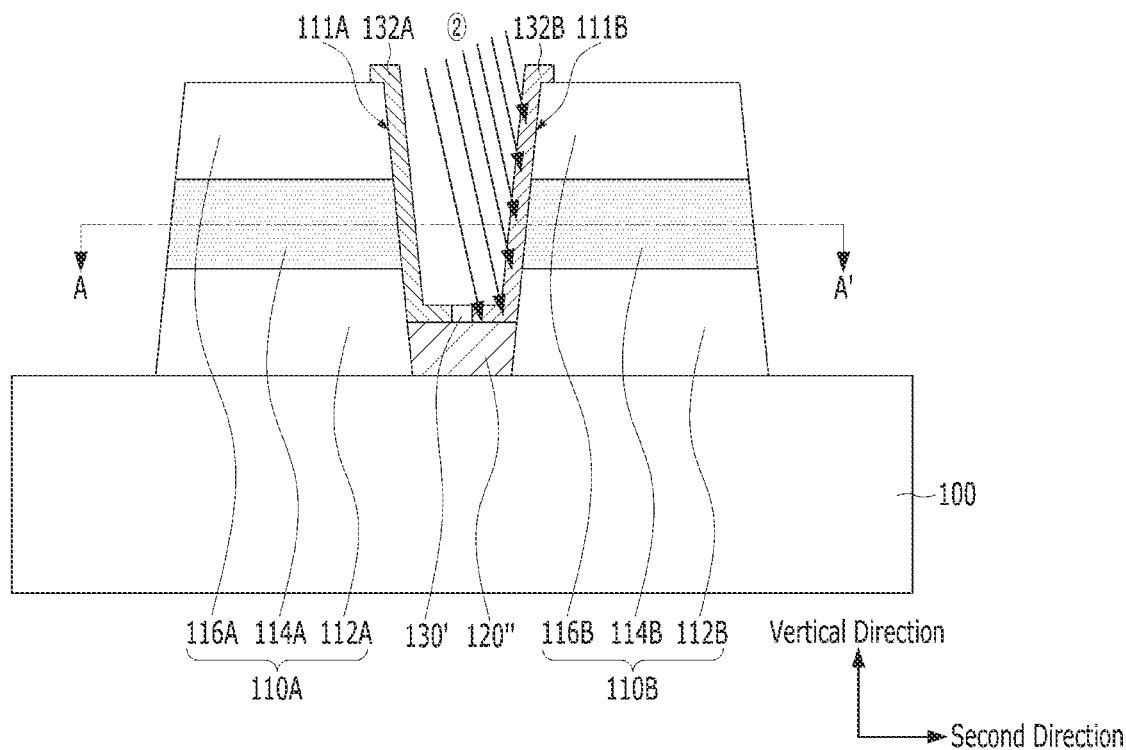
Figure 6B:
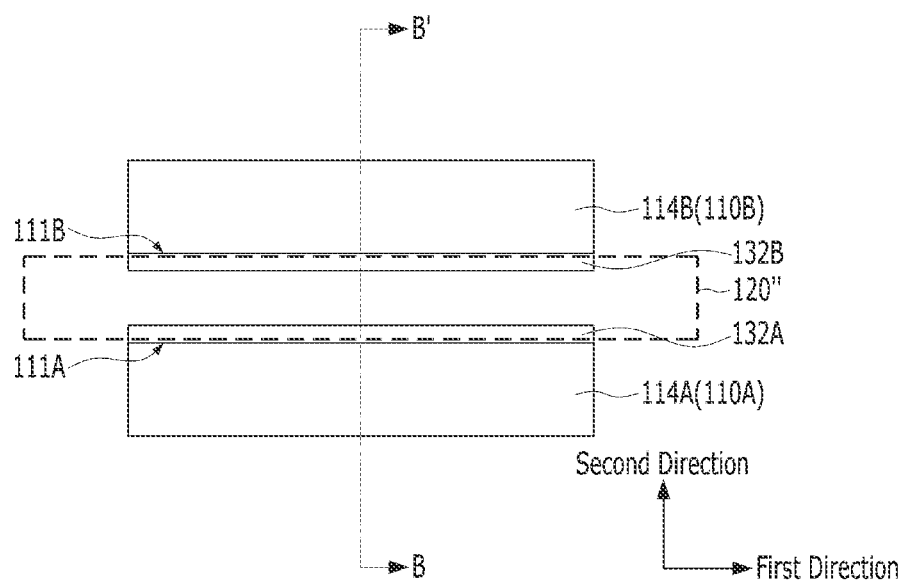

Referring to FIGS. 6A and 6B, a second doped layer 132B may be formed by doping an impurity of a second conductivity type onto the material layer pattern 130' on one side 111B of the second initial stacked structure 110B. For example, the second doped layer 132B may serve as a channel of a PMOS transistor, and for this purpose, a high-concentration P-type impurity may be doped.

The P-type impurity may be doped by a tilt implantation method slanting toward one side 111B of the second initial stacked structure 110B (refer to the arrow ②). The angle of the tilt implantation may be adjusted in such a manner that the P-type impurity is doped onto the entire material layer pattern 130' on one side 111B of the second initial stacked structure 110B. In this case, since the P-type impurity is doped to the lowermost portion of the material layer pattern 130', the lower end of the second doped layer 132B may contact the lower electrode layer 120" to be electrically connected to the lower electrode layer 120".

The embodiment of the present invention disclosure illustrates a case where the portion between the lower end of the first doped layer 132A and the lower end of the second doped layer 132B (see 130' in FIG. 6A) is not doped with any impurity and thus an undoped semiconductor material is maintained. However, the present invention disclosure is not limited thereto, and the lower end of the first doped layer 132A and the lower end of the second doped layer 132B may contact each other (not shown), or a mixed region (not show) of an N-type impurity and a P-type impurity may exist between the lower end of the first doped layer 132A and the lower end of the second doped layer 132B.

Meanwhile, the order of the process of forming the first doped layer 132A and the process of forming the second doped layer 132B may be reversed. In other words, the second doped layer 132B may be formed first, and then the first doped layer 132A may be formed later. The conductivity types of the impurities doped onto the first doped layer 132A and the second doped layer 132B may also be reversed. In other words, the first doped layer 132A may be a P-type doped layer, and the second doped layer 132B may be an N-type doped layer.

Figure 7A:
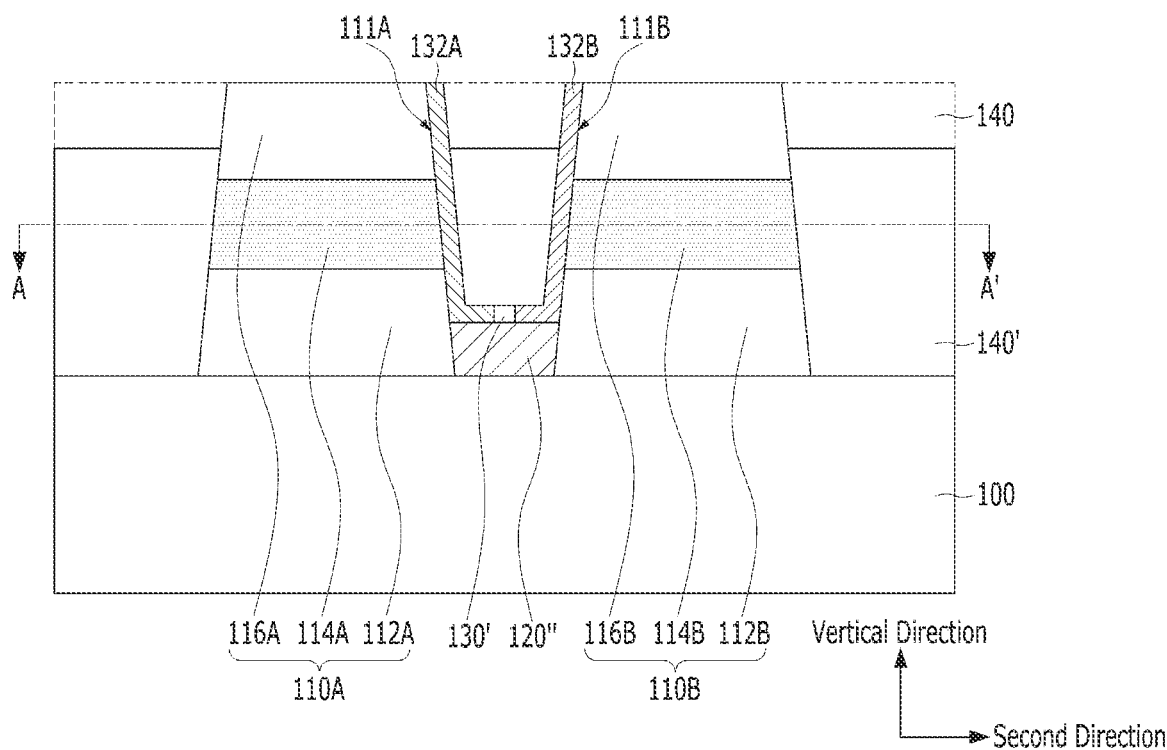
Figure 7B:
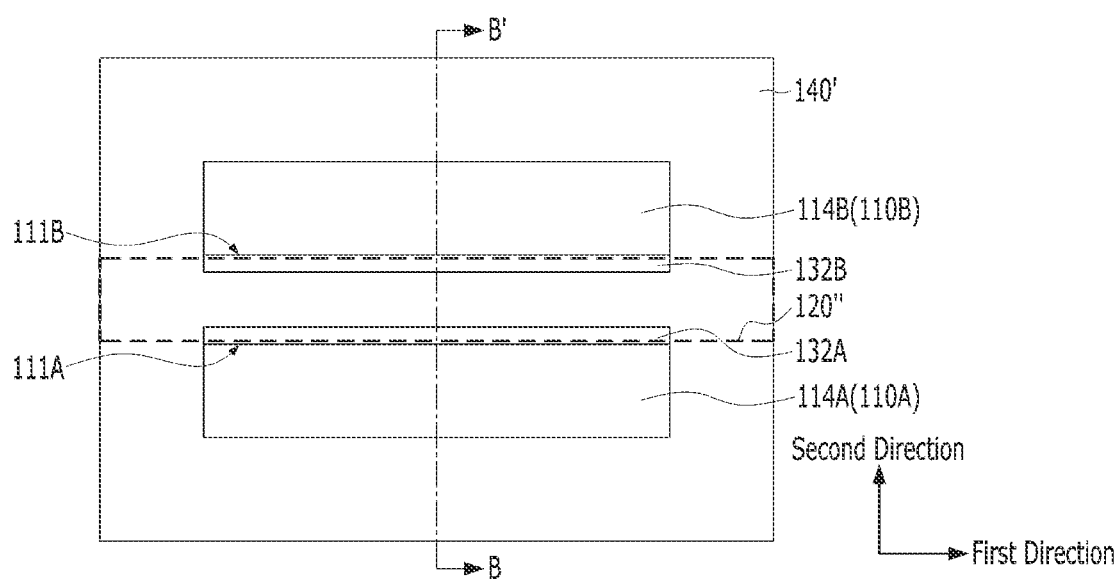

Referring to FIGS. 7A and 7B, after forming a dielectric material having a thickness sufficient to cover the process results of FIGS. 6A and 6B over the substrate 100, a first initial inter-layer dielectric material 140 may be formed by performing a planarization process, such as Chemical Mechanical Polishing (CMP) until the upper surfaces of the first and second initial stacked structures 110A and 110B are exposed. The first initial inter-layer dielectric material 140 may include a dielectric material, e.g., SiO₂, having an etch rate which is different from those of the first and second sacrificial layers 114A and 114B, the first and second lower dielectric layers 112A and 112B, and the first and second upper dielectric layers 116A and 116B. In this process, a portion of the first and second doped layers 132A and 132B protruding above the first and second initial stacked structures 110A and 110B may be removed. When the first and second doped layers 132A and 132B further extend onto the upper surfaces of the first and second initial stacked structures 110A and 110B, a portion of the first and second doped layers 132A and 132B over the upper surfaces of the first and second initial stacked structures 110A and 110B may be removed in this process.

Subsequently, a first inter-layer dielectric layer 140' may be formed by removing a portion of the first initial inter-layer dielectric material 140 through an etch-back process or the like. In the vertical direction, the upper surface of the first inter-layer dielectric layer 140' may be positioned below the upper surfaces of the first and second initial stacked structures 110A and 110B and above the upper surfaces of the first and second sacrificial layers 114A and 114B. As a result, an upper portion of the first doped layer 132A and an upper portion of the second doped layer 132B may be exposed and not covered by the first inter-layer dielectric layer 140'. The process of forming the first inter-layer dielectric layer 140' may be performed to decrease the contact resistance by increasing the contact area between the first and second upper electrode layers and the first and second channel layers, which will be described later, and/or to properly control the height of the lower surfaces of first and second additionally doped layers when first and second additionally doped layers are formed. This process may be omitted.

Figure 8A:
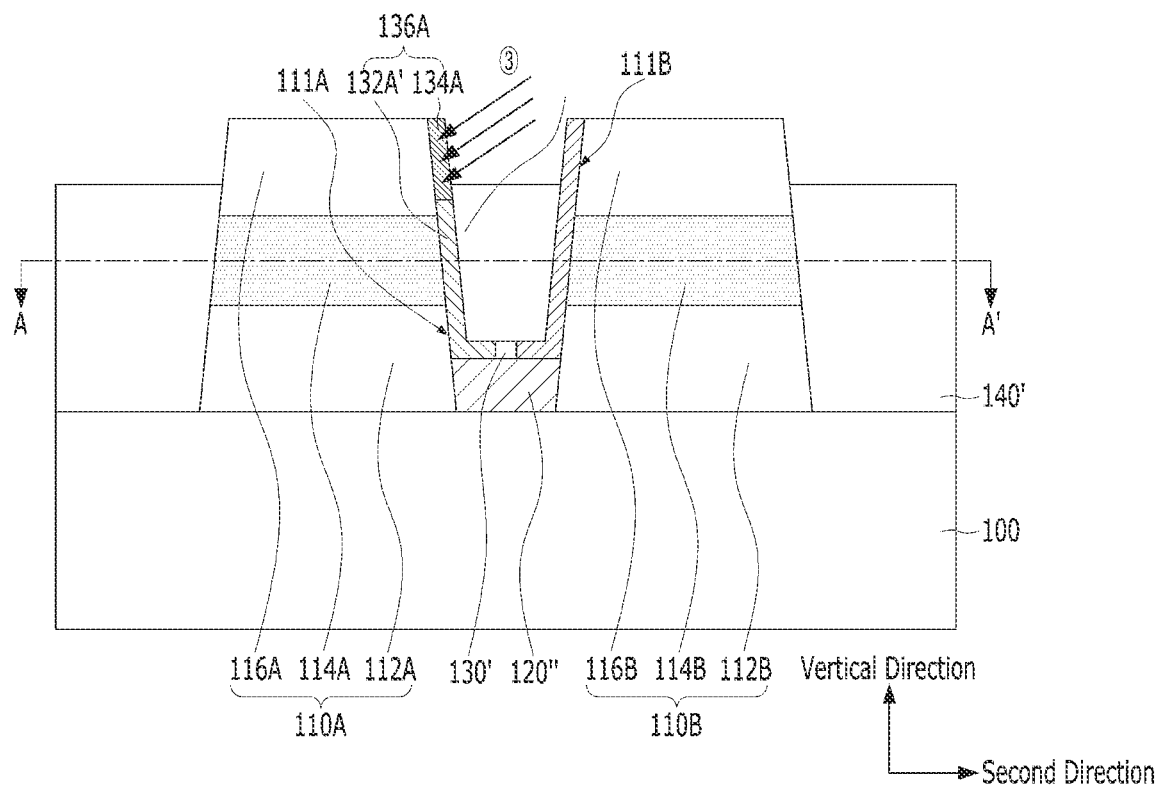
Figure 8B:
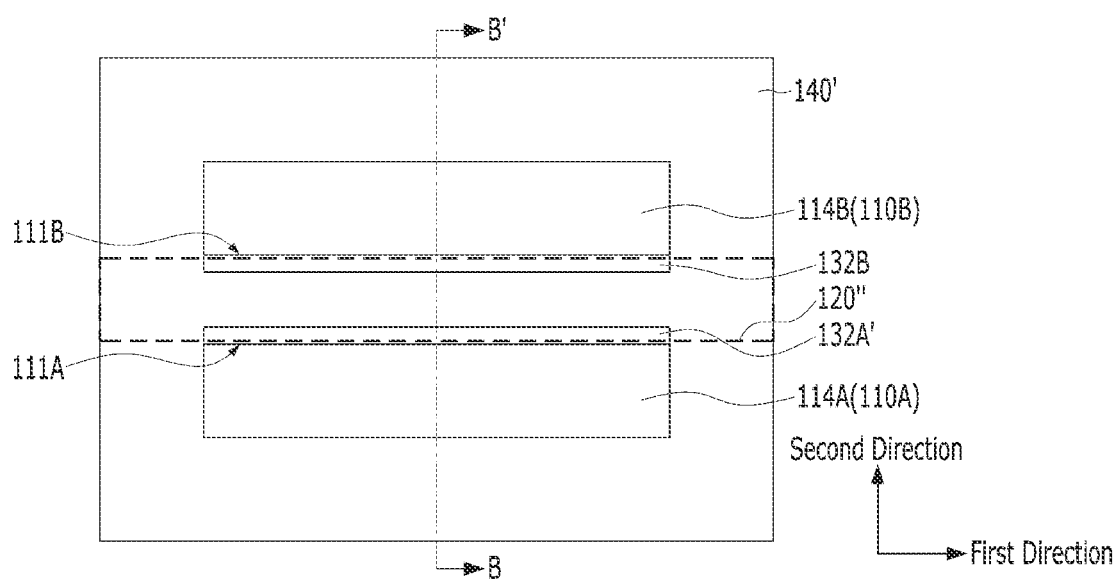

Referring to FIGS. 8A and 8B, the first additionally doped layer 134A may be formed by additionally doping an impurity whose conductivity type is the same as that of the impurity of the first doped layer 132A, for example, an N-type impurity, onto the upper surface of the first doped layer 132A which is exposed by the process of FIGS. 7A and 7B. As the first additionally doped layer 134A is formed, the first doped layer 132A which is positioned below the first additionally doped layer 134A and is not additionally doped with an impurity may be denoted by a reference numeral 132A'. The concentration of the impurity of the first additionally doped layer 134A may be higher than the concentration of the impurity of the first doped layer 132A'. Since a heat treatment for activation after impurity doping is an essential process, the lower surface of the first additionally doped layer 134A may be lowered to a predetermined extent from the upper surface of the first inter-layer dielectric layer 140'. Even in this case, too, the lower surface of the first additionally doped layer 134A may be controlled to be positioned at a height equal to the upper surface of the first sacrificial layer 114A or higher than the upper surface of the first sacrificial layer 114A.

Doping of the impurity for forming the first additionally doped layer 134A may be performed through a tilt implantation method slanting toward one side 111A of the first initial stacked structure 110A (see arrow ③). The angle of the tilt implantation may be smaller than the angle of the tilt implantation of FIGS. 5A and 5B based on a horizontal plane, for example, the surface of the substrate 100.

The first additionally doped layer 134A and the first doped layer 132A' may be referred to as a first channel layer 136A hereinafter. The first channel layer 136A may correspond to a channel of an NMOS transistor. The first additionally doped layer 134A may function to reduce the contact resistance with the first upper electrode layer, which will be described later. In an embodiment, the first additionally doped layer 134A may be omitted. When the process of forming the first additionally doped layer 134A is omitted, the first doped layer 132A of FIGS. 7A and 7B may function as a channel of the NMOS transistor.

Figure 9A:
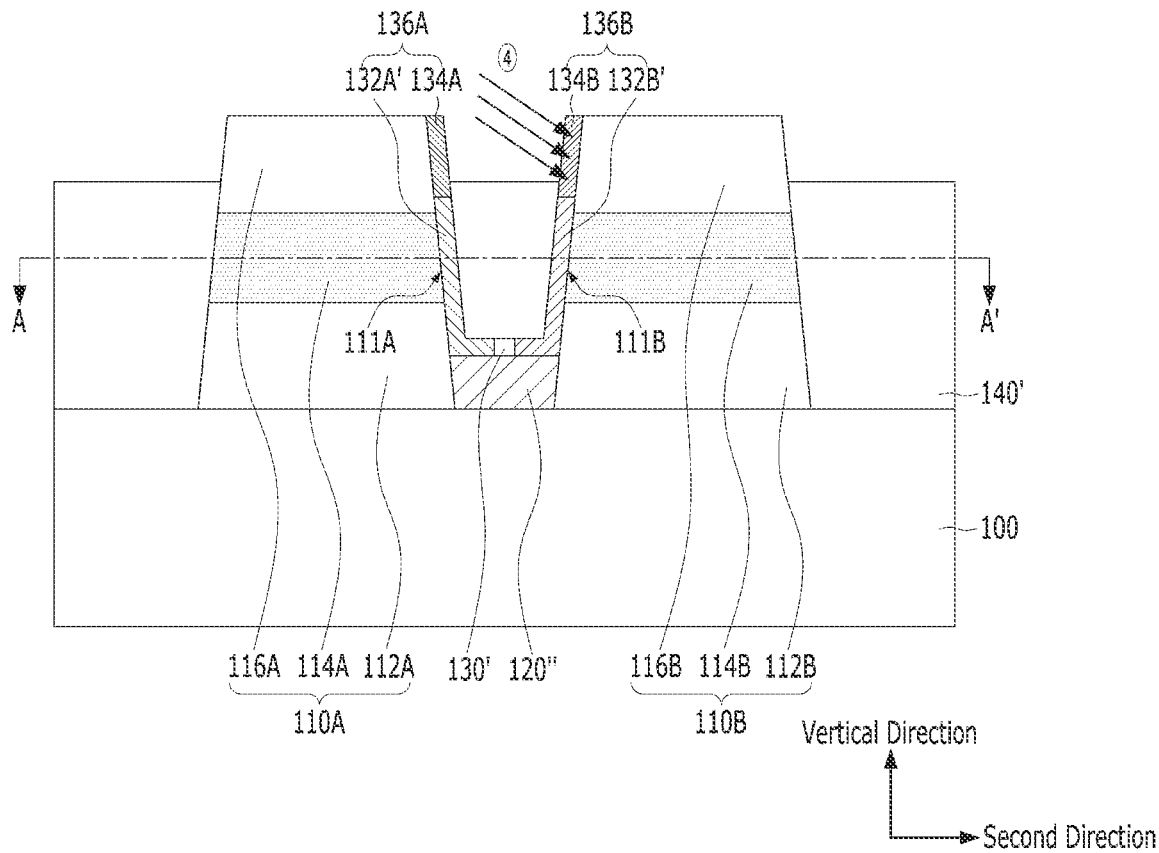
Figure 9B:
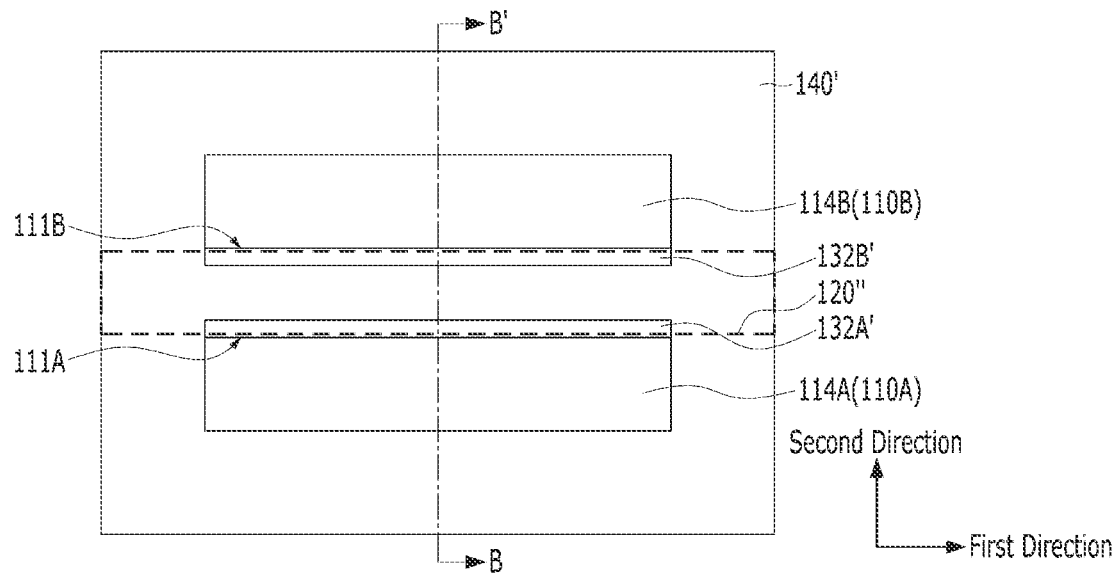

Referring to FIGS. 9A and 9B, a second additionally doped layer 134B may be formed by additionally doping an impurity whose conductivity type is the same as that of the impurity of the second doped layer 132B, for example, a P-type impurity, onto the upper portion of the second doped layer 132B which is exposed by the process of FIGS. 7A and 7B. As the second additionally doped layer 134B is formed, the second doped layer 132B which is positioned below the second additionally doped layer 134B and which is not additionally doped with an impurity may be denoted by a reference numeral 132B'. The concentration of the impurity of the second additionally doped layer 134B may be higher than the concentration of the impurity of the second doped layer 132B'. Since a heat treatment for activation after impurity doping is an essential process, the lower surface of the second additionally doped layer 134B may be lowered to a predetermined extent from the upper surface of the first inter-layer dielectric layer 140'. Even in this case, too, the lower surface of the second additionally doped layer 134B may be controlled to be positioned at a height of equal to or higher than the upper surface of the second sacrificial layer 114B.

The doping of an impurity for forming the second additionally doped layer 134B may be performed through a tilt implantation method slanting toward one side 111B of the second initial stacked structure 110B (refer to arrow ④). The angle of the tilt implantation may be smaller than the angle of the tilt implantation of FIGS. 6A and 6B based on the horizontal plane, for example, the surface of the substrate 100.

The second additionally doped layer 134B and the second doped layer 132B' will be referred to as a second channel layer 136B, hereinafter. The second channel layer 136B may correspond to a channel of a PMOS transistor. The second additionally doped layer 134B may function to reduce the contact resistance with the second upper electrode layer, which will be described later. In an embodiment, the second additionally doped layer 134B may be omitted. When the process of forming the second additionally doped layer 134B is omitted, the second doped layer 132B of FIGS. 7A and 7B may function as a channel of the PMOS transistor.

Meanwhile, the order of the processes of forming the first and second additionally doped layers 134A and 134B may be reversed. For example, the second additionally doped layer 134B may be formed first and then the first additionally doped layer 134A may be formed later.

Figure 10A:
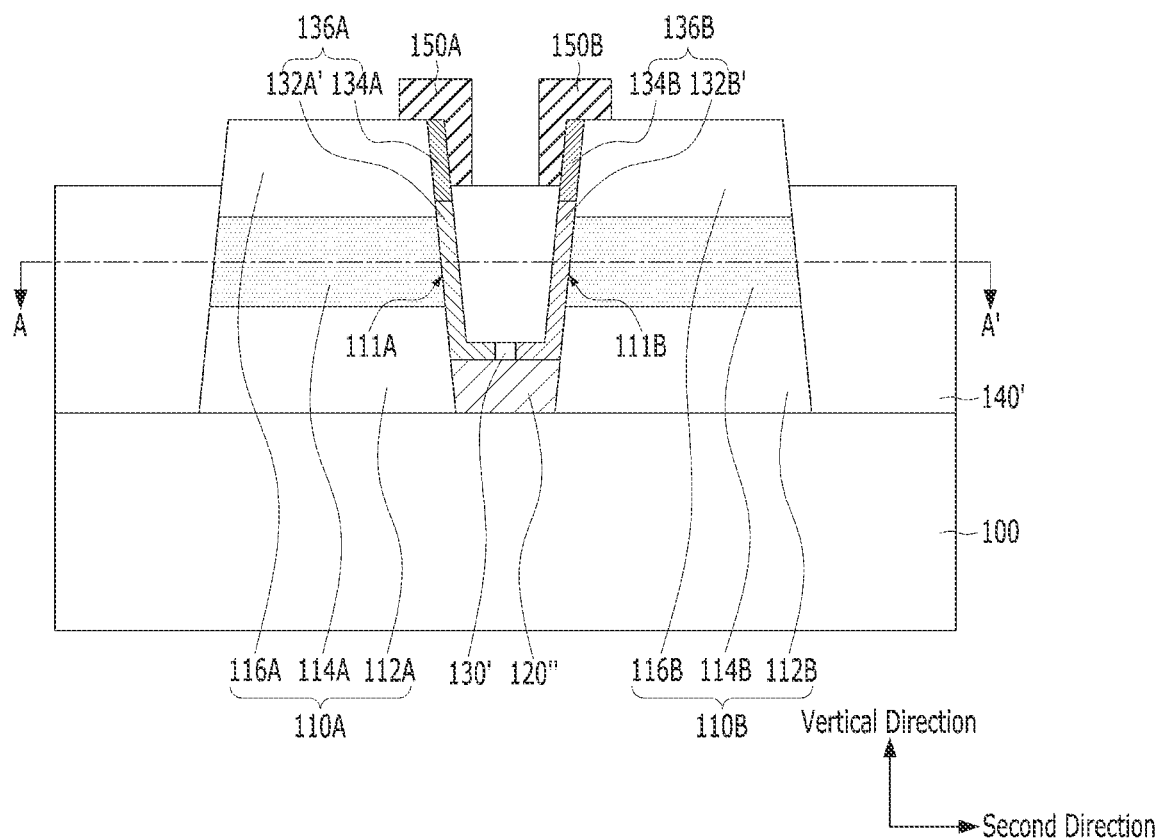
Figure 10B:
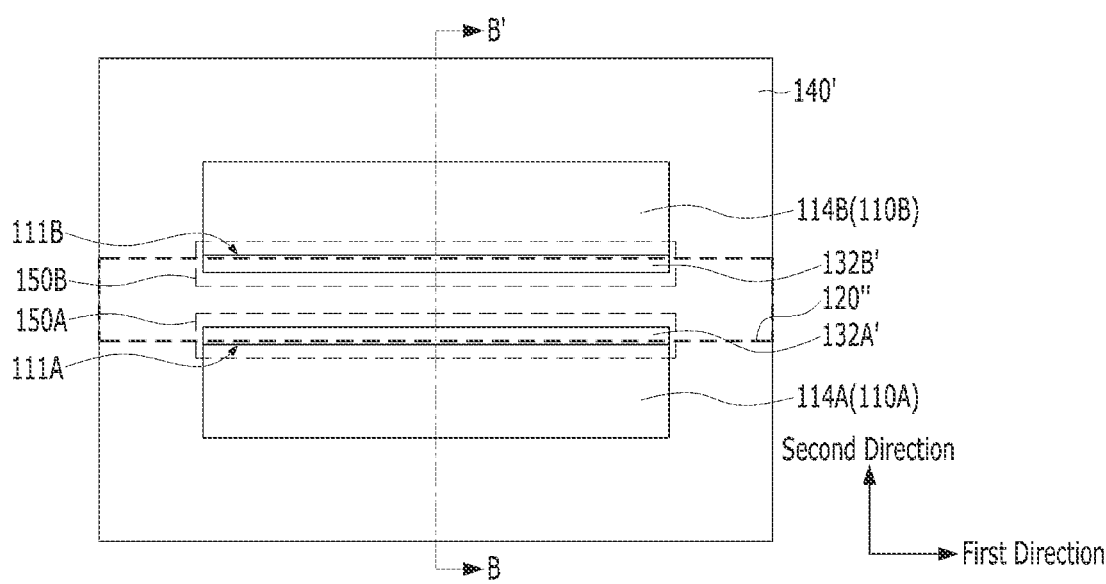

Referring to FIGS. 10A and 10B, first and second upper electrode layers 150A and 150B may be formed over the process results of FIGS. 9A and 9B. The first and second upper electrode layers 150A and 150B may be formed to respectively contact the first and second channel layers 136A and 136B. The first and second upper electrode layers 150A and 150B may be electrically connected to the first and second channel layers 136A and 136B. When the lower electrode layer 120" functions as a common source electrode of an NMOS transistor and a PMOS transistor, the first upper electrode layer 150A and the second upper electrode layer 150B may serve as a drain electrode of an NMOS transistor and a drain electrode of a PMOS transistor, respectively. For the sake of convenience in description, in the plan view of FIG. 10B, the shapes of the first and second upper electrode layers 150A and 150B, which are not seen at the height of the line A-A' of FIG. 10A, are shown by dotted lines.

From the perspective of a plan view, the first and second upper electrode layers 150A and 150B may have a rectangular shape respectively overlapping with the first and second channel layers 136A and 136B. For example, each of the first and second upper electrode layers 150A and 150B may have a bar shape whose side length in the first direction is longer than the side length in the second direction. Furthermore, from the perspective of a plan view, each of the first and second upper electrode layers 150A and 150B may have a width which is equal to or greater than the widths of the first and second channel layers 136A and 136B in the second direction.

From the perspective of a cross section, the first upper electrode layer 150A may extend from the upper surface of the first channel layer 136A to a portion of the upper surface of the first initial stacked structure 110A which is disposed adjacent thereto and extend to the side of the upper portion of the first channel layer 136A protruding from the first inter-layer dielectric layer 140'. Also, from the perspective of a cross section, the second upper electrode layer 150B may extend from the upper surface of the second channel layer 136B to a portion of the upper surface of the second initial stacked structure 110B which is positioned adjacent thereto and extend to the side of the upper portion of the second channel layer 136B protruding from the first inter-layer dielectric layer 140'. As a result, since the first upper electrode layer 150A covers the upper surface and a portion of the side of the first channel layer 136A, the contact area between the first upper electrode layer 150A and the first channel layer 136A may be increased, which decreases contact resistance. Also, since the second upper electrode layer 150B covers the upper surface and a portion of the side of the second channel layer 136B, the contact area between the second upper electrode layer 150B and the second channel layer 136B may be increased, which decreases the contact resistance. Furthermore, since the first upper electrode layer 150A contacts the first additionally doped layer 134A having a higher impurity concentration than the first doped layer 132A' of the first channel layer 136A and the second upper electrode layer 150B contacts the second additionally doped layer 134B having a higher impurity concentration than the second doped layer 132B' of the second channel layer 136B, the contact resistance between the first upper electrode layer 150A and the first channel layer 136A and the contact resistance between the second upper electrode layer 150B and the second channel layer 136B may be further reduced.

These first and second upper electrode layers 150A and 150B may be formed by depositing and patterning a conductive material over the process results of FIGS. 9A and 9B, and they may include diverse conductive materials, for example, metals such as platinum (Pt), tungsten (W), aluminum (Al), copper (Cu), tantalum (Ta), titanium (Ti), ruthenium (Ru), molybdenum (Mo) and the like, compounds of these metals, and/or alloys of these metals.

Figure 11A:
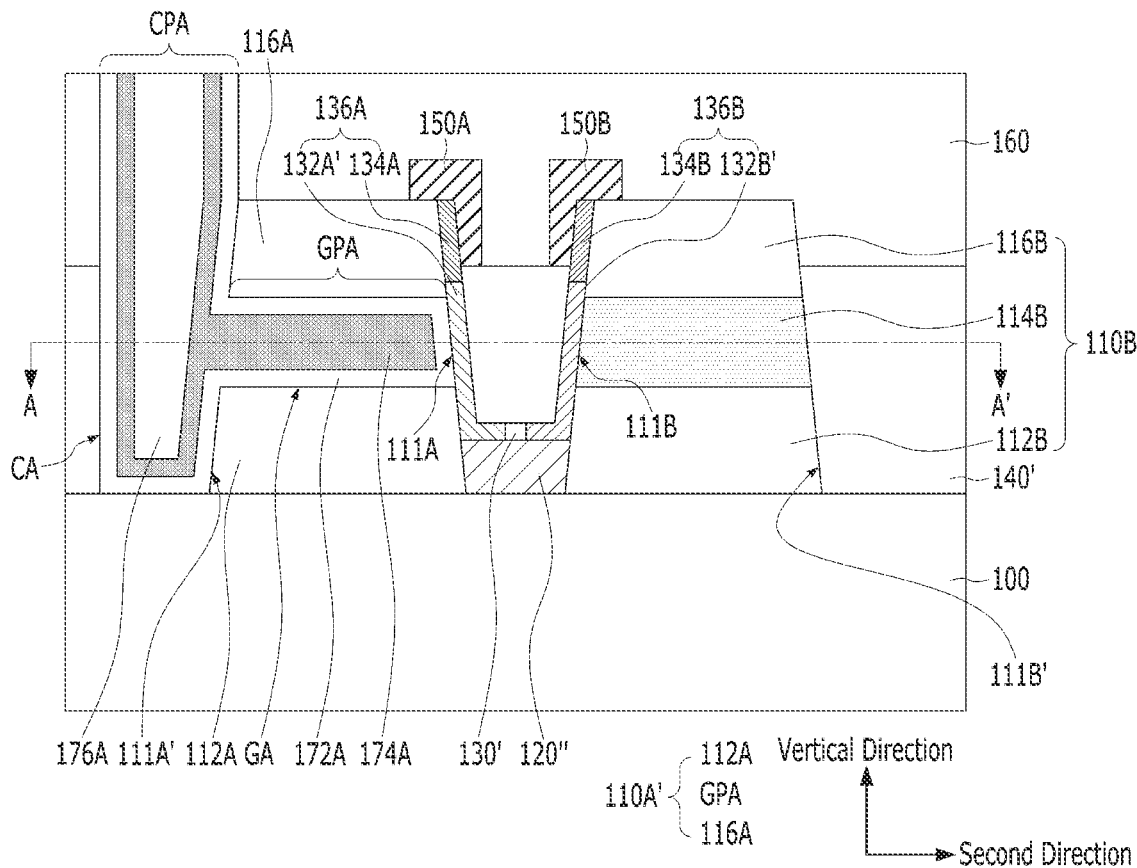
Figure 11B:
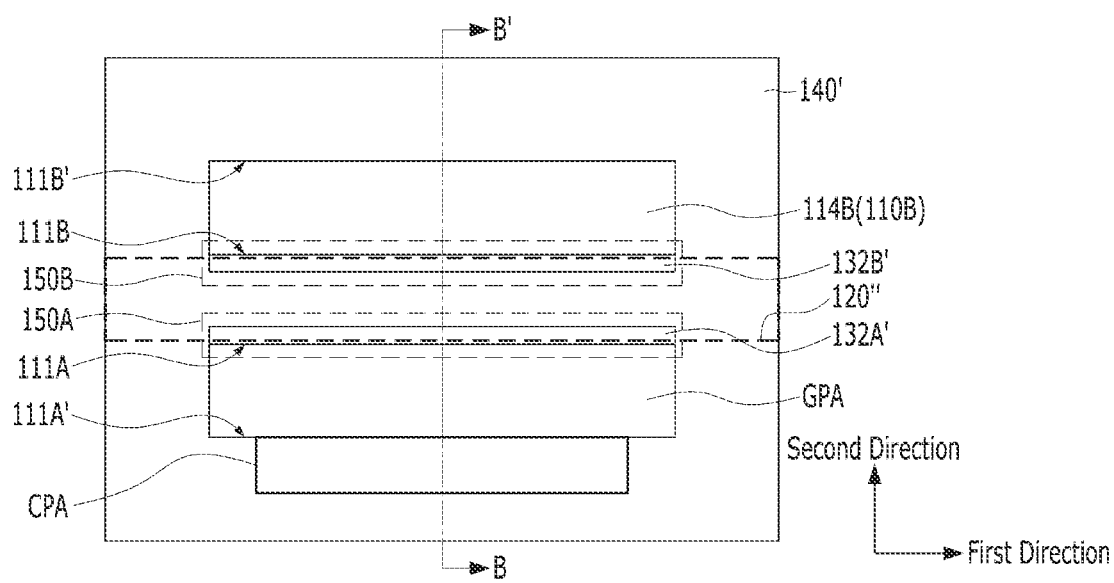

Referring to FIGS. 11A and 11B, a second inter-layer dielectric layer 160 covering the structure that results from the process of FIGS. 10A and 10B may be formed. The second inter-layer dielectric layer 160 may include a dielectric material, e.g., SiO$_2$, having a different etch rate from those of the first and second sacrificial layers 114A and 114B, the first and second lower dielectric layers 112A and 112B, and the first and second upper dielectric layers 116A and 116B.

Subsequently, by selectively etching the second inter-layer dielectric layer 160 and the first inter-layer dielectric layer 140', a first contact hole CA may be formed exposing a first side 111A of the first initial stacked structure 110A and at least a portion of a second side 111A' which is opposite to the first side 111A, in particular, a second side of the first sacrificial layer 114A. From the perspective of the vertical direction, the first contact hole CA may be formed to have a depth that the lower surface of the first contact hole CA is positioned at a height equal to or lower than the lower surface of the first sacrificial layer 114A. For example, the first contact hole CA may be formed to a depth exposing the substrate 100 as illustrated in the drawing. Also, from the perspective of a plan view, the first contact hole CA is illustrated to have a bar shape in which the length in the first direction is longer than the length in the second direction and the length in the first direction is slightly shorter than the side length of the first initial stacked structure 110A in the first direction. However, the present invention disclosure is not limited thereto, and the shape and/or size of the first contact hole CA on a plane may be diversely modified as long as the first contact hole CA exposes the first sacrificial layer 114A in the second side 111A' of the first initial stacked structure 110A to remove the first sacrificial layer 114A.

Subsequently, the first sacrificial layer 114A exposed by the first contact hole CA may be removed. The space formed by the removal of the first sacrificial layer 114A may be referred to as a first groove portion GA, hereinafter. The first sacrificial layer 114A may be removed by an isotropic etching process. Since the first inter-layer dielectric layer 140', the second inter-layer dielectric layer 160, the first lower dielectric layer 112A, and the first upper dielectric layer 116A may be formed of a material having a different etch rate from that of the first sacrificial layer 114A, these layers 140', 160, 112A, and 116A may be maintained when the first sacrificial layer 114A is removed.

Subsequently, a first gate dielectric layer 172A may be formed along the inner walls of the first contact hole CA and the first groove portion GA. The first gate dielectric layer 172A may be conformally formed to have a thin thickness that does not completely fill the first contact hole CA and the first groove portion GA.

Subsequently, a first gate electrode layer 174A may be formed along the surface of the first gate dielectric layer 172A in the first contact hole CA and the first groove portion GA in which the first gate dielectric layer 172A is formed. In an embodiment, the first gate electrode layer 174A may be conformally formed to have a thickness that completely fills the first groove portion GA and does not completely fill the first contact hole CA. However, the present invention disclosure is not limited thereto. In another embodiment, the first gate electrode layer 174A may be formed to have a thickness that completely fills the first contact hole CA and the first groove portion GA. In yet another embodiment, the first gate electrode layer 174A may be formed to have a thickness that fills a portion of the first contact hole CA and a portion of the first groove portion GA.

The first gate electrode layer 174A may function as a gate electrode of an NMOS transistor, and thus it may include a metal-containing material having an effective work function appropriate for an NMOS transistor. The metal-containing material may include a metal, a compound of the metal, or an alloy of the metal. When the first channel layer 136A is doped with a high-concentration N-type impurity, the first gate electrode layer 174A may include a metal-containing material having a relatively large work function, such as TaN (Tantalum Nitride) or TiN (Titanium Nitride), so that a portion of the first channel layer 136A facing the first gate electrode layer 174A may become a depletion region to reduce the off current of the NMOS transistor.

Subsequently, a first metal-containing layer 176A may be formed to fill the remaining space of the first contact hole CA in which the first gate electrode layer 174A is formed. The first metal-containing layer 176A may be a metal-containing material having a lower resistance than the first gate electrode layer 174A, for example, a metal such as tungsten (W), molybdenum (Mo), ruthenium (Ru), a compound of the metal, or an alloy of the metal. The first metal-containing layer 176A may have a lower resistance than the first gate electrode layer 174A, and thus may serve to facilitate the transfer of current/voltage to the first gate electrode layer 174A. In another embodiment in which the first gate electrode layer 174A completely fills the first contact hole CA and the first groove portion GA, the first metal-containing layer 176A may be omitted. In yet another embodiment in which the first gate electrode layer 174A does not completely fill the first contact hole CA and the first groove portion GA, the first metal-containing layer 176A may be formed to completely fill the remaining spaces of the first contact hole CA and the first groove portion GA in which the first gate dielectric layer 172A and the first gate electrode layer 174A are formed.

Among the first gate dielectric layer 172A, the first gate electrode layer 174A, and/or the first metal-containing layer 176A, a portion buried in the first groove portion GA may be referred to as a first horizontal gate structure GPA, and a portion filling the first contact hole CA may be referred to as a first vertical gate structure CPA. The first horizontal gate structure GPA may include the first gate electrode layer 174A, and the first gate dielectric layer 172A which surrounds the upper surface of the first gate electrode layer 174A, the lower surface of the first gate electrode layer 174A, and a side of the first gate electrode layer 174A facing the first side 111A. As a result, the first gate dielectric layer 172A may be interposed between the first gate electrode layer 174A and the first channel layer 136A. The first vertical gate structure CPA may include the first metal-containing layer 176A having a columnar shape, the first gate electrode layer 174A surrounding the side and lower surface of the first metal-containing layer 176A while extending from the first horizontal gate structure GPA, and the first gate dielectric layer 172A surrounding the side and lower surface of the first gate electrode layer 174A of the first vertical gate structure CPA while extending from the first horizontal gate structure GPA. Since the first horizontal gate structure GPA fills the first groove portion GA, it may have substantially the same plane and cross-sectional shape as those of the first sacrificial layer 114A, which is described above. Since the first vertical gate structure CPA is buried in the first contact hole CA, it may have substantially the same plane and cross-sectional shape as those of the first contact hole CA, which is described above. Also, a stacked structure of the first lower dielectric layer 112A, the first horizontal gate structure GPA, and the first upper dielectric layer 116A formed by replacing the first sacrificial layer 114A with the first horizontal gate structure GPA may be referred to as a first stacked structure 110A', hereinafter.

As a result, an NMOS transistor including the first horizontal gate structure GPA, the first channel layer 136A, the lower electrode layer 120", and the first upper electrode layer 150A may be fabricated.

Figure 12A:
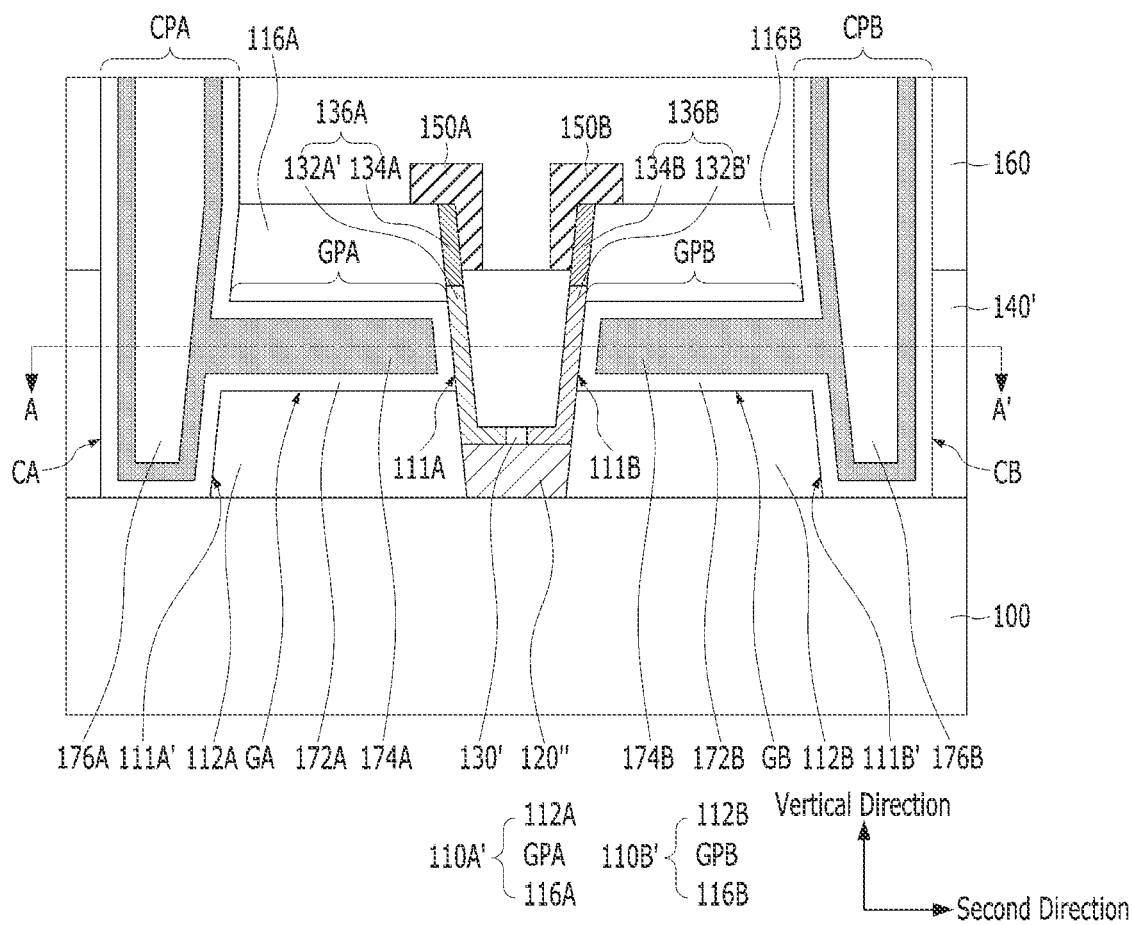
Figure 12B:
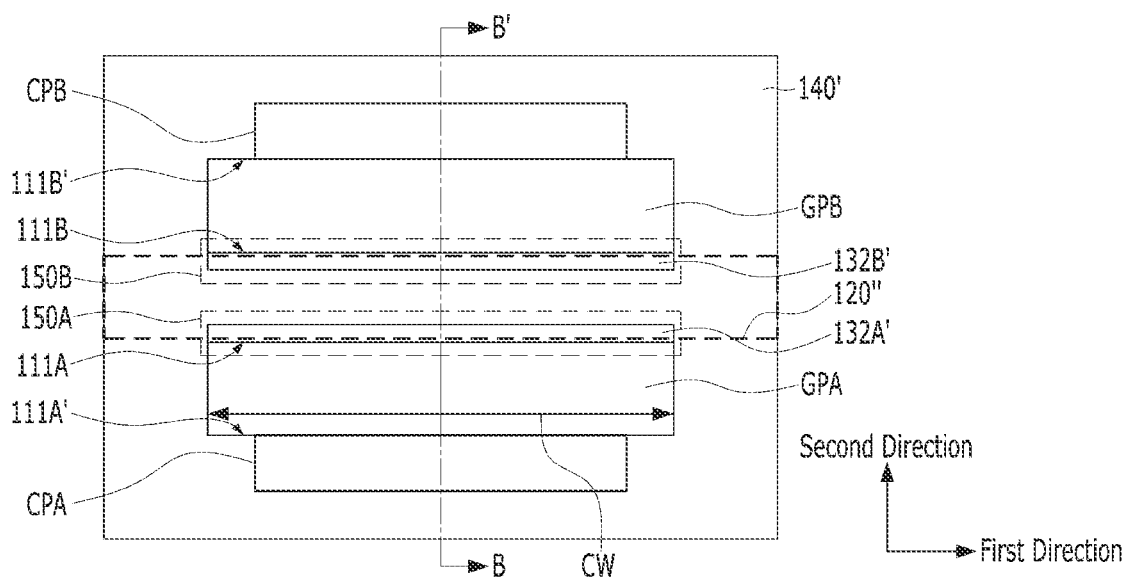

Referring to FIGS. 12A and 12B, the second inter-layer dielectric layer 160 and the first inter-layer dielectric layer 140' may be selectively etched to form a second contact hole CB that exposes the first side 111B of the second initial stacked structure 110B and at least a portion of the second side 111B' which is opposite to the first side 111B, in particular, the second side of the second sacrificial layer 114B. In the vertical direction, the second contact hole CB may be formed to have a depth that makes the lower surface of the second contact hole CB positioned at a height equal to or lower than the lower surface of the second sacrificial layer 114B. For example, the second contact hole CB may be formed to have a depth that exposes the substrate 100 as illustrated in the drawing. Also, from the perspective of a plan view, the second contact hole CB is illustrated to have a bar shape in which the length in the first direction is longer than the length in the second direction and the length in the first direction is slightly shorter than the side length of the second initial stacked structure 110B in the first direction. However, the present invention disclosure is not limited thereto, and the shape or size of the second contact hole CB on a plane may be diversely modified as long as the removal of the second sacrificial layer 114B is possible by exposing the second sacrificial layer 114B on the second side 111B' of the second initial stacked structure 110B.

Subsequently, the second sacrificial layer 114B exposed by the formation of the second contact hole CB may be removed. The space formed by the removal of the second sacrificial layer 114B may, hereinafter, be referred to as a second groove portion GB.

Subsequently, a second gate dielectric layer 172B may be formed along the inner walls of the second contact hole CB and the second groove portion GB. The second gate dielectric layer 172B may be conformally formed to have a thin thickness that does not completely fill the second contact hole CB and the second groove portion GB.

Subsequently, a second gate electrode layer 174B may be formed along the surface of the second gate dielectric layer 172B in the second contact hole CB and the second groove portion GB where the second gate dielectric layer 172B is formed. For example, the second gate electrode layer 174B may be conformally formed to have a thickness that does not completely fill the second contact hole CB while completely filling the second groove portion GB. However, the present invention disclosure is not limited thereto. In another embodiment of the present invention, the second gate electrode layer 174B may be formed to have a thickness that completely fills the second groove portion GB and the second contact hole CB. Alternatively, yet in another embodiment, the second gate electrode layer 174B may be formed to have a thickness that fills a portion of the second contact hole CB and a portion of the second groove portion GB.

The second gate electrode layer 174B may function as a gate electrode of a PMOS transistor. The second gate electrode layer 174B may include a metal-containing material having an effective work function appropriate for a PMOS transistor. For example, when the second channel layer 136B is doped with a high-concentration P-type impurity, the second gate electrode layer 174B may include a metal-containing material, e.g., TiAl or TiC, having a relatively small work function so that a portion of the second channel layer 136B facing the second gate electrode layer 174B may be depleted and, thus, the off current of the PMOS transistor may be reduced.

Subsequently, a second metal-containing layer 176B may be formed to fill the remaining space of the second contact hole CB in which the second gate electrode layer 174B is formed. The second metal-containing layer 176B may include a metal-containing material having a lower resistance than the second gate electrode layer 174B, for example, a metal such as tungsten (W), molybdenum (Mo) and ruthenium (Ru), a compound of the metal, or an alloy of the metal. As the second metal-containing layer 176B has a lower resistance than that of the second gate electrode layer 174B, it may serve to facilitate the transfer of current/voltage to the second gate electrode layer 174B. In another embodiment, when the second gate electrode layer 174B completely fills the second contact hole CB and the second groove portion GB, the second metal-containing layer 176B may be omitted. Alternatively, yet in another embodiment, when the second gate electrode layer 174B does not completely fill the second contact hole CB and the second groove portion GB, the second metal-containing layer 176B may be formed to completely fill the remaining space of the second contact hole CB and the second groove portion GB in which the second gate dielectric layer 172B and the second gate electrode layer 174B are formed.

Among the second gate dielectric layer 172B, the second gate electrode layer 174B, and/or the second metal-containing layer 176B, a portion filling the second groove portion GB may be referred to as a second horizontal gate structure GPB, and a portion filling the second contact hole CB will be referred to as a second vertical gate structure CPB. The second horizontal gate structure GPB may include the second gate electrode layer 174B, and the second gate dielectric layer 172B which surrounds the upper surface of the second gate electrode layer 174B, the lower surface of the second gate electrode layer 174B, and the side of the second gate electrode layer 174B facing the first side 111B. Accordingly, the second gate dielectric layer 172B may be interposed between the second gate electrode layer 174B and the second channel layer 136B. The second vertical gate structure CPB may include the column-shaped second metal-containing layer 176B, the second gate electrode layer 174B which extends from the second horizontal gate structure GPB and surrounds the side and lower surface of the second metal-containing layer 176B, and the second gate dielectric layer 172B which extends from the second horizontal gate structure GPB and surrounds the side and lower surface of the second gate electrode layer 174B of the second vertical gate structure CPB. Since the second horizontal gate structure GPB fills the second groove portion GB, it may have substantially the same plane and cross-sectional shape as those of the above-described second sacrificial layer 114B. Since the second vertical gate structure CPB is buried in the second contact hole CB, it may have substantially the same plane and cross-sectional shape as those of the above-described second contact hole CB. Also, a stacked structure of the second lower dielectric layer 112B, the second horizontal gate structure GPB, and the second upper dielectric layer 116B which is formed by replacing the second sacrificial layer 114B with the second horizontal gate structure GPB may be referred to as a second stacked structure 110B', hereinafter.

As a result, a PMOS transistor including the second horizontal gate structure GPB, the second channel layer 136B, the lower electrode layer 120", and the second upper electrode layer 150B may be formed.

Furthermore, a CMOS transistor including an NMOS transistor and a PMOS transistor that share the lower electrode layer 120" may be formed.

After formation, the CMOS transistor may be electrically connected to the lower electrode layer 120", the first and second upper electrode layers 150A and 150B, and the first and second horizontal gate structures GPA and GPB. Diverse wiring structures may be formed to control them. This will be described below with reference to FIGS. 13A to 14B.

Figure 13A:
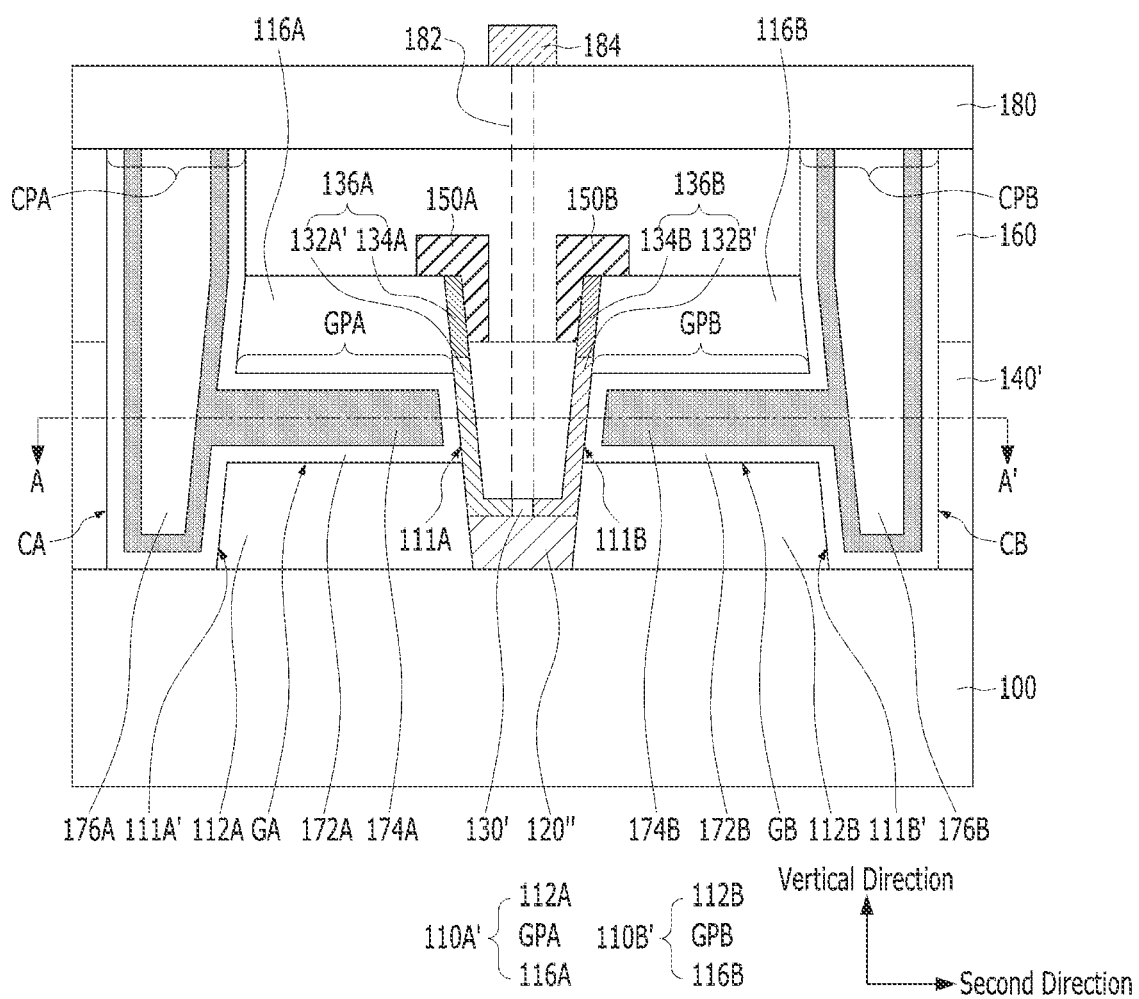
Figure 13B:
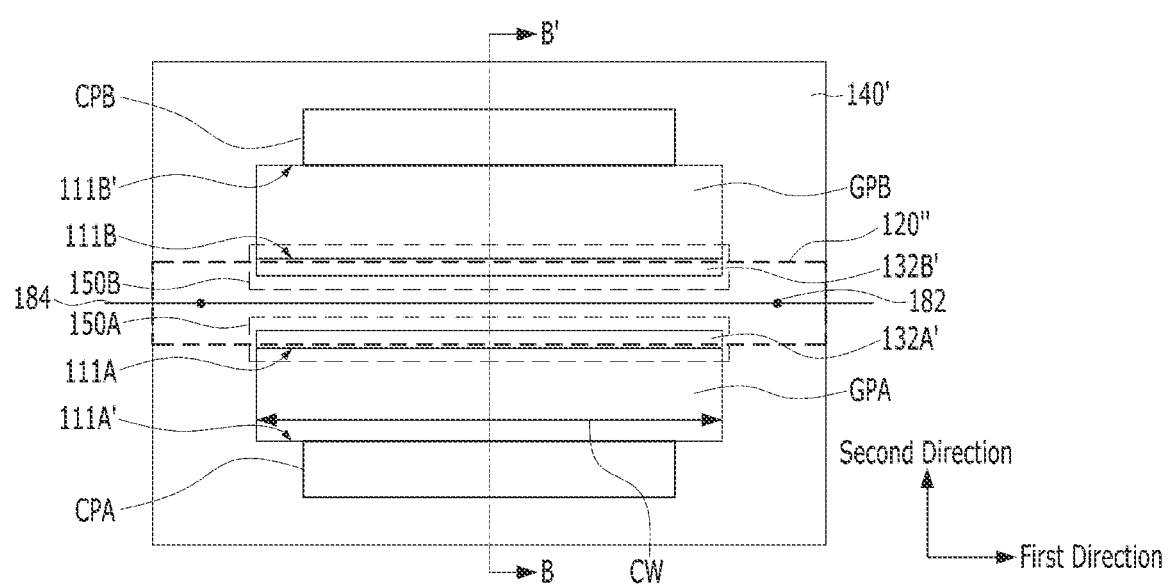

Referring to FIGS. 13A and 13B, a third inter-layer dielectric layer 180 may be formed over the structure resulting from the process of FIGS. 12A and 12B. The third inter-layer dielectric layer 180 may include diverse dielectric materials, such as $SiO_2$.

Subsequently, a lower electrode contact 182 may be formed to be coupled to the lower electrode layer 120" and may pass through the third inter-layer dielectric layer 180, the second inter-layer dielectric layer 160, and the first inter-layer dielectric layer 140'. In the first direction, the lower electrode contact 182 may not be positioned between the first stacked structure 110A' and the second stacked structure 110B' but positioned outside the space between the first stacked structure 110A' and the second stacked structure 110B'. This is because when the space between the first stacked structure 110A' and the second stacked structure 110B' is narrow, it is difficult to form the lower electrode contact 182. As an example, the two lower electrode contacts 182 may be positioned on first sides 111A and 111B and second sides 111A' and 111B' of the first and second initial stacked structures 110A and 110B in the first direction. However, the present invention disclosure is not limited thereto, and the number of and the arrangement of the lower electrode contacts 182 may be diversely modified based on the assumption that they may overlap with and be coupled to the lower electrode layer 120". For the sake of convenience in description, in the cross-sectional view of FIG. 13A, the shape of the lower electrode contact 182, which is not seen on the line B-B' of FIG. 13B, is shown by a dotted line. Also, in the cross-sectional view of FIG. 13B, the lower electrode contacts 182 are shown as dots. The lower electrode contact 182 may be formed by selectively etching the third inter-layer dielectric layer 180, the second inter-layer dielectric layer 160, and the first inter-layer dielectric layer 140' so as to form a contact hole that exposes the lower electrode layer 120" and then filling the contact hole with a conductive material, including but not limited to metal.

Subsequently, a lower electrode line 184 extending in one direction may be formed over the third inter-layer dielectric layer 180 while overlapping with and coupled to the lower electrode contact 182. When the two lower electrode contacts 182 are arranged in the first direction as shown in this embodiment of the present invention disclosure, the lower electrode line 184 may extend in the first direction so as to overlap with and couple to both of the two lower electrode contacts 182. The lower electrode line 184 may be electrically connected to the lower electrode layer 120" through the lower electrode contact 182, and thus it may function as a common source line that drives the lower electrode layer 120". For the sake of convenience in description, in the plan view of FIG. 13B, the lower electrode line 184, which is not seen at the height of the line A-A' of FIG. 13A, is illustrated by a solid line.

Figure 14A:
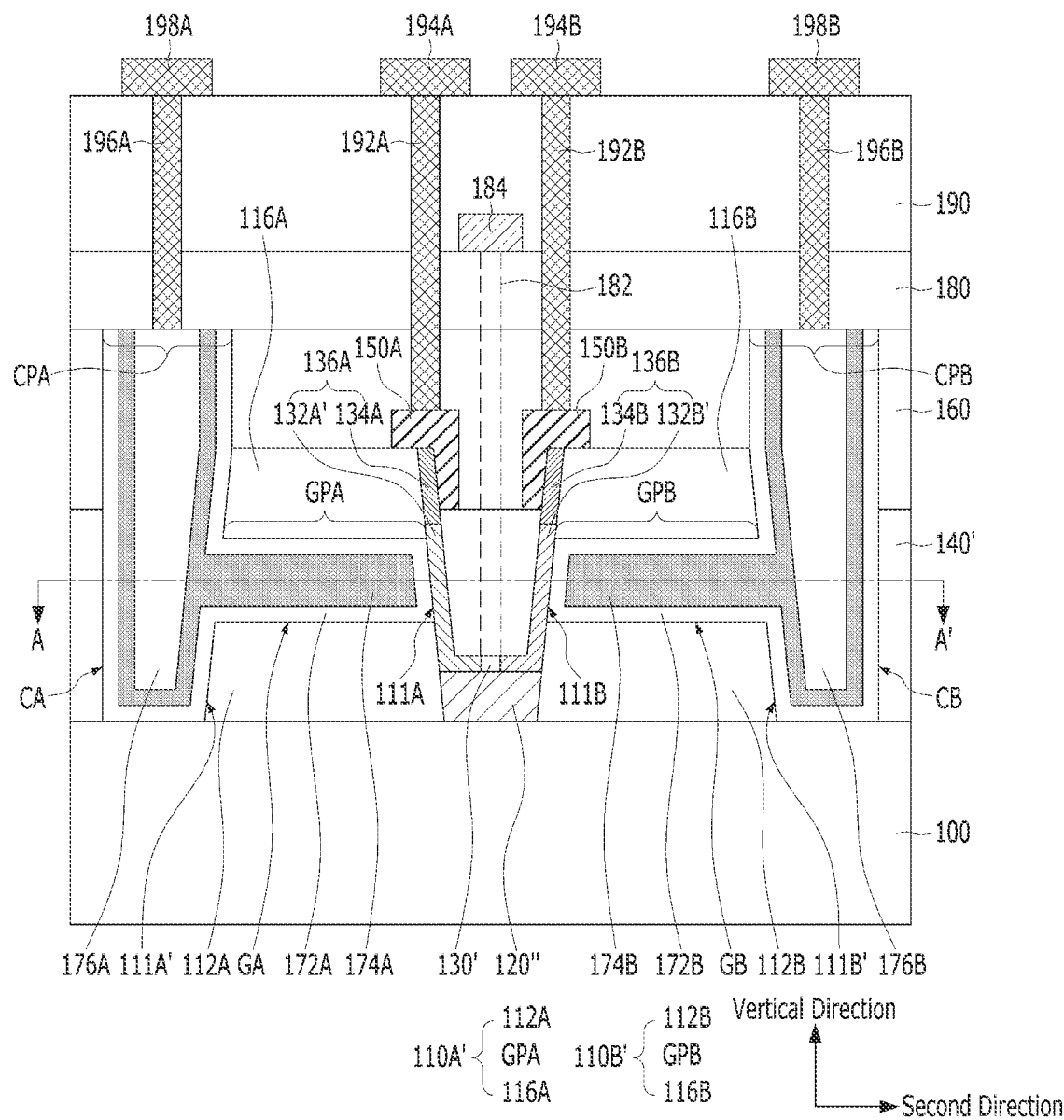
Figure 14B:
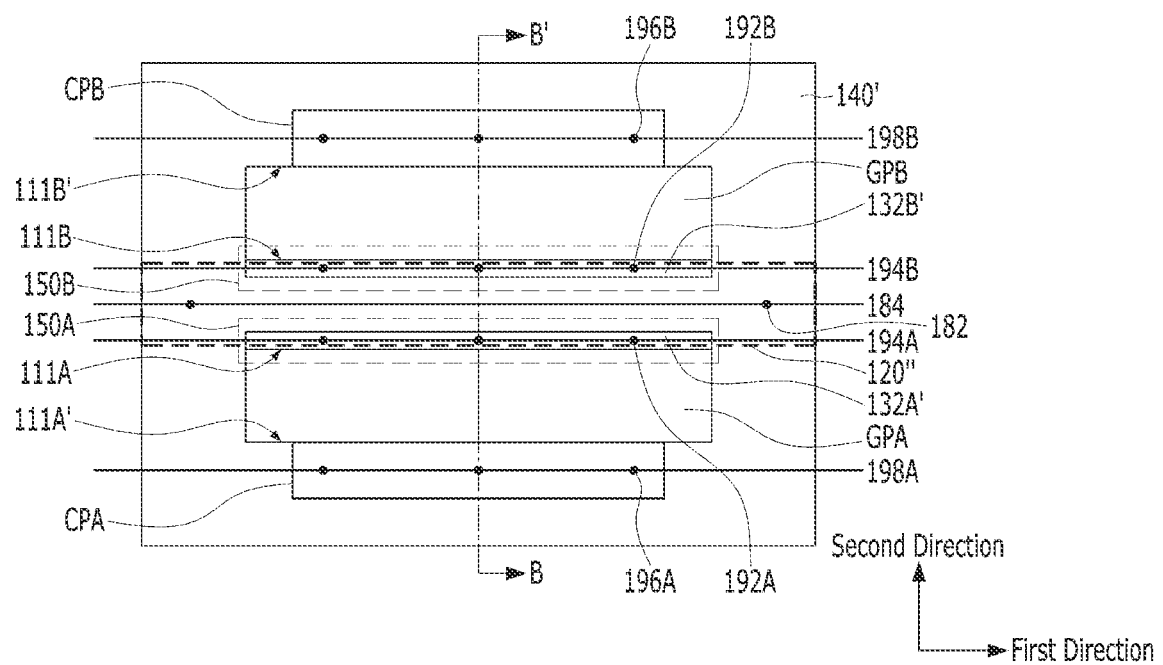

Referring to FIGS. 14A and 14B, a fourth inter-layer dielectric layer 190 may be formed over the structure resulting from the process of FIGS. 13A and 13B. The fourth inter-layer dielectric layer 190 may have a thickness which is sufficiently thick to cover the lower electrode line 184. As shown in FIG. 14A, the fourth inter-layer dielectric layer 190 may have a thickness which is greater than the thickness of the lower electrode line 184. The fourth inter-layer dielectric layer 190 may be made of any suitable dielectric material, including, for example, $SiO_2$.

Subsequently, first and second upper electrode contacts 192A and 192B may be formed through the fourth inter-layer dielectric layer 190, the third inter-layer dielectric layer 180, and the second inter-layer dielectric layer 160. The first and second upper electrode layers 150A and 150B may be respectively coupled to the first and second upper electrode contacts 192A and 192B. According to an embodiment of the present invention disclosure, a plurality of first upper electrode contacts 192A may be arranged in a line along the first direction while being coupled to the first upper electrode layer 150A, and a plurality of second upper electrode contacts 192B may be arranged in a line along the first direction while being coupled to the second upper electrode layer 150B. However, the present invention disclosure is not limited thereto, and the number and arrangement of the first and second upper electrode contacts 192A and 192B may be diversely modified as long as they overlap with and are coupled to the first and second upper electrode layers 150A and 150B, respectively. The first and second upper electrode contacts 192A and 192B may be formed by a method of selectively etching the fourth inter-layer dielectric layer 190, the third inter-layer dielectric layer 180, and the second inter-layer dielectric layer 160 so as to form a contact hole exposing the first and second upper electrode layers 150A and 150B, and then filling the contact hole with a suitable conductive material, including, for example, a metal.

Subsequently, first and second upper electrode lines 194A and 194B extending in one direction while respectively overlapping with and coupled to the first and second upper electrode contacts 192A and 192B may be formed over the fourth inter-layer dielectric layer 190. When the first upper electrode contacts 192A are arranged in a line along the first direction in this embodiment of the present invention disclosure, the first upper electrode line 194A may extend in the first direction. Likewise, when the second upper electrode contacts 192B are arranged in a line along the first direction, the second upper electrode line 194B may extend in the first direction. As the first upper electrode line 194A is electrically connected to the first upper electrode layer 150A through the first upper electrode contact 192A, the first upper electrode line 194A may function as a first bit line that drives the first upper electrode layer 150A. The second upper electrode line 194B may function as a second bit line that drives the second upper electrode layer 150B, as the second upper electrode line 194B is electrically connected to the second upper electrode layer 150B through the second upper electrode contact 192B.

Also, a first gate contact 196A and a second gate contact 196B may be formed penetrating the fourth inter-layer dielectric layer 190 and the third inter-layer dielectric layer 180 to be coupled to the first vertical gate structure CPA and the second vertical gate structure CPB, respectively. In the embodiment of the present invention disclosure, a plurality of first gate contacts 196A may be arranged in a line along the first direction while being coupled to the first vertical gate structure CPA, and a plurality of second gate contacts 196B may be arranged in a line along the first direction while being coupled to the second vertical gate structure CPB. The number and arrangement of the first and second gate contacts 196A and 196B may be diversely modified as long as they overlap with and are coupled to the first and second vertical gate structures CPA and CPB. The first and second gate contacts 196A and 196B may be formed by selectively etching the fourth inter-layer dielectric layer 190 and the third inter-layer dielectric layer 180 so as to form a contact hole that exposes the first and second vertical gate structures CPA and CPB and then filling the contact hole with a suitable conductive material, including, for example, a metal. The process of forming the first and second gate contacts 196A and 196B and the process of forming the first and second upper electrode contacts 192A and 192B may be performed simultaneously.

Subsequently, first and second gate lines 198A and 198B extending in one direction while overlapping with and coupled to the first and second gate contacts 196A and 196B, respectively, may be formed over the fourth inter-layer dielectric layer 190. When the first gate contacts 196A are arranged in a line along the first direction according to an embodiment of the present invention disclosure, the first gate line 198A may extend in the first direction. Likewise, when the second gate contacts 196B are arranged in a line along the first direction, the second gate line 198B may extend in the first direction. As the first gate line 198A is electrically connected to the first horizontal gate structure GPA through the first gate contact 196A and the first vertical gate structure CPA, it may function as a first word line that drives the first horizontal gate structure GPA. As the second gate line 198B is electrically connected to the second horizontal gate structure GPB through the second gate contact 196B and the second vertical gate structure CPB, it may function as a second word line that drives the second horizontal gate structure GPB. The process of forming the first and second gate lines 198A and 198B and the process of forming the first and second upper electrode lines 194A and 194B may be performed simultaneously.

For the sake of convenience in description, in the plan view of FIG. 14B, the first and second upper electrode contacts 192A and 192B which are not visible at the height of line A-A' of FIG. 14A, the first and second upper electrode lines 194A and 194B, the first and second gate contacts 196A and 196B, and the first and second gate lines 198A and 198B are shown by dotted and solid lines.

Illustrated in this embodiment of the present invention disclosure is a case where the lower electrode line 184 is positioned below the first and second upper electrode lines 194A and 194B and the first and second gate lines 198A and 198B in the vertical direction. This is because when the lower electrode line 184 and the first and second upper electrode lines 194A and 194B are positioned at the same level, an electrical shortage may occur due to a narrow gap between them. Also, in this embodiment of the present invention disclosure, a case where the first and second upper electrode lines 194A and 194B and the first and second gate lines 198A and 198B are positioned at the same level in the vertical direction is illustrated. This is because a sufficient gap may be secured between them. However, the present invention disclosure is not limited thereto. The positions of the lower electrode line 184, the first and second upper electrode lines 194A and 194B, and the first and second gate lines 198A and 198B in the vertical direction may be diversely modified.

By the fabrication method described above, the semiconductor device of this embodiment may be fabricated.

Referring back to FIGS. 14A and 14B, the semiconductor device according to various embodiments of the present invention disclosure may include: a substrate 100, a first stacked structure 110A' which is disposed over the substrate 100 and includes a first lower dielectric layer 112A, a first horizontal gate structure GPA, and a first upper dielectric layer 116A that are stacked in the vertical direction, a second stacked structure 110B' which is disposed over the substrate 100 to have a first side 111B facing a first side 111A of the first stacked structure 110A' and includes a second lower dielectric layer 112B, a second horizontal gate structure GPB, and a second upper dielectric layer 116B that are stacked in the vertical direction, a first channel layer 136A which is formed to face at least the first horizontal gate structure GPA on the first side 111A of the first stacked structure 110A', a second channel layer 136B which is formed to face at least the second horizontal gate structure GPB on the first side 111B of the second stacked structure 110B', a lower electrode layer 120" which is disposed between the first stacked structure 110A' and the second stacked structure 110B' and commonly coupled to the lower ends of the first and second channel layers 136A and 136B, a first upper electrode layer 150A which is coupled to the upper end of the first channel layer 136A, and a second upper electrode layer 150B which is coupled to the upper end of the second channel layer 136B.

Also, over the substrate 100, a first vertical gate structure CPA extending in the vertical direction while being coupled to the first horizontal gate structure GPA in the second side 111A' positioned in opposite to the first side 111A of the first stacked structure 110A', and a second vertical gate structure CPB extending in the vertical direction while being coupled to the second horizontal gate structure GPB on the second side 111B' disposed in opposite to the first side 111B of the second stacked structure 110B' may be formed.

The lower electrode layer 120", the first and second vertical gate structures CPA and CPB, and the first and second upper electrode layers 150A and 150B may be driven by diverse shapes of wiring structures, for example, the lower electrode contact 182, the lower electrode line 184, the first and second gate contacts 196A and 196B, the first and second gate lines 198A and 198B, the first and second upper electrode contacts 192A and 192B, and the first and second upper electrode lines 194A and 194B, which are illustrated in the drawing.

Since the details of the constituent elements of the semiconductor device according to an embodiment of the present invention disclosure have already been described in the process of describing the fabrication method, they will be omitted.

According to the above-described semiconductor device and the method of fabricating the same, the following effects may be obtained.

First, the first and second channel layers 136A and 136B functioning as channels of an NMOS transistor and a PMOS transistor extend in the vertical direction and, thus, the distance between the first channel layer 136A and the second channel layer 136B in the horizontal direction may be reduced. As a result, the planar area of the semiconductor device and the parasitic capacitance originating from the first and second channel layers 136A and 136B may both be reduced also.

Furthermore, by forming the first and second channel layers 136A and 136B by doping an impurity on a thin-film material layer 130, the thickness of the first and second channel layers 136A and 136B may be reduced, improving the controllability of a transistor. However, in this case, driving current may be decreased, but this may be compensated by increasing the width and/or length of the first and second channel layers 136A and 136B in the first direction.

Also, differently from a typical planar-type transistor in which a gate electrode faces a source/drain contact and thereby produces much parasitic capacitance, there may be a few contacts or no contacts facing the first and second horizontal gate structures GPA and GPB and the first and second vertical gate structures CPA and CPB. For example, in an embodiment of the present invention disclosure, the lower electrode contact 182 and the first and second upper electrode contacts 192A and 192B may not face the first and second horizontal gate structures GPA and GPB and first and second vertical gate structures CPA and CPB, or may face a portion of the first and second horizontal gate structures GPA and GPB and first and second vertical gate structures CPA and CPB. As a result, the parasitic capacitance may be further reduced compared to a planar transistor.

Figure 15:
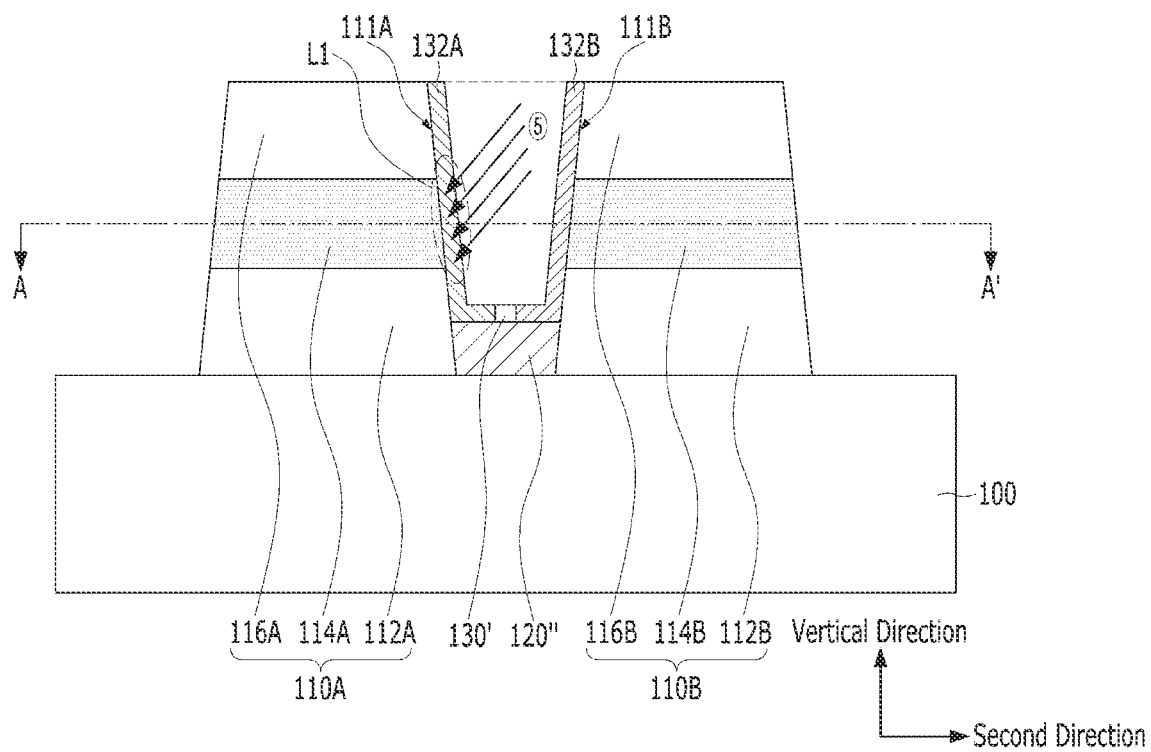
FIGS. 15 and 16 are cross-sectional views illustrating a semiconductor device and a method for fabricating the semiconductor device in accordance with another embodiment of the present invention disclosure.
Figure 16:
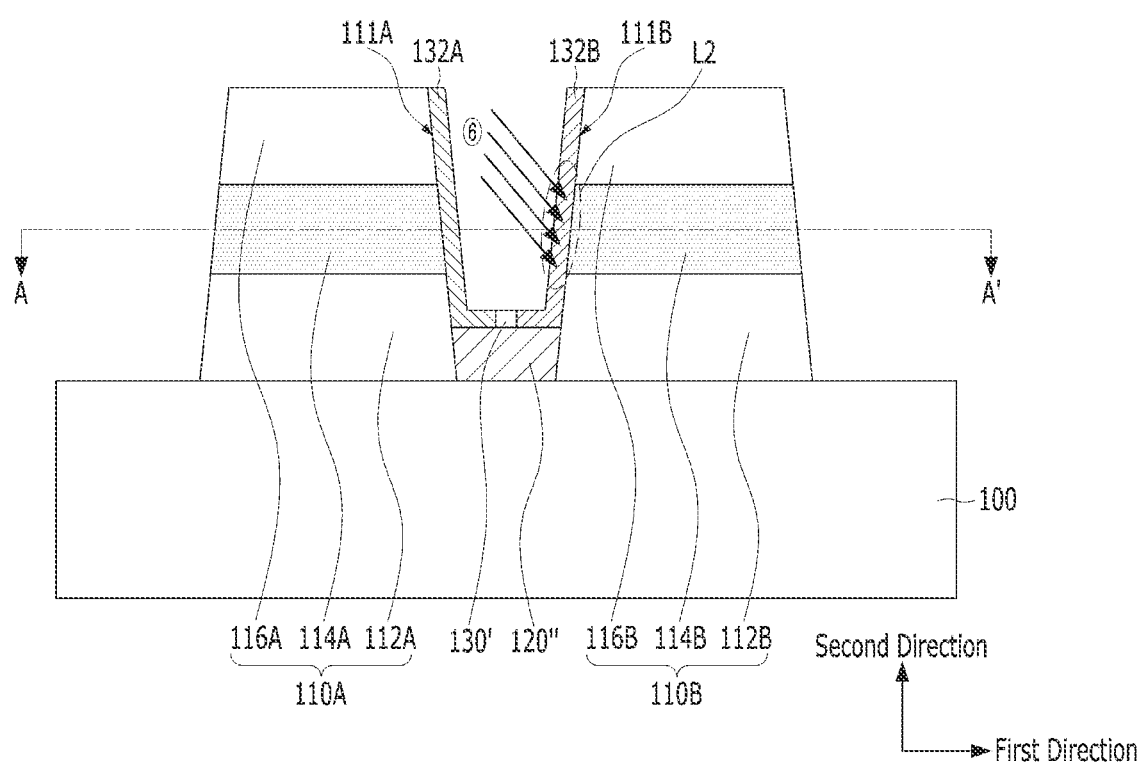

FIGS. 15 and 16 are cross-sectional views illustrating a semiconductor device and a method for fabricating the semiconductor device in accordance with another embodiment of the present invention disclosure. In particular, FIG. 15 shows an intermediate process step that may be performed between the process of FIGS. 5A and 5B and the process of FIGS. 7A and 7B, and FIG. 16 shows an intermediate process step that may be performed between the process of FIGS. 6A and 6B and the process of FIGS. 7A and 7B.

Referring to FIG. 15, after the formation of the first doped layer 132A, an impurity of a conductivity type, e.g., a P-type impurity, that is different from that of the impurity of the first doped layer 132A may be counter-doped on a region L1 of the first doped layer 132A facing the first sacrificial layer 114A. As an example, the region L1 may be a region of the first doped layer 132A that is substantially at the same or similar level with the first sacrificial layer 114A. The concentration of the counter-doped P-type impurity may be lower than the concentration of the N-type impurity in the first doped layer 132A. In this case, in the region L1, the concentration of the N-type impurity may decrease while the N type is maintained so that the off current of the NMOS transistor may be reduced. When the first sacrificial layer 114A is replaced with a gate electrode layer in the subsequent process, a metal-containing material having a relatively small work function, such as TiAl (Titanium Aluminide) or TiC (Titanium carbide), may be used as a gate electrode layer. This is because, unlike the above-described embodiment of the present invention disclosure, since the N-type impurity of the region L1 of the first doped layer 132A has a relatively low concentration, a separate process of forming a depletion region is not required.

The doping of an impurity for forming the region L1 may be performed using a tilt implantation method slanting toward a first side 111A of the first initial stacked structure 110A (refer to arrow ⑤). The angle of the tilt implantation may be smaller than the angle of the tilt implantation of FIGS. 5A and 5B and may be greater than the angle of the tilt implantation of FIGS. 8A and 8B based on a horizontal plane, for example, the surface of the substrate 100. The angle of the tilt implantation as this term is used here is the angle formed between the direction of the implantation and the horizontal plane.

Referring to FIG. 16, after the formation of the second doped layer 132B, an impurity of a conductivity type, e.g., an N-type impurity, that is different from that of the impurity of the second doped layer 132B may be counter-doped on a region L2 of the second doped layer 132B facing the second sacrificial layer 114B. As an example, the region L2 may be a region of the second doped layer 132B which is substantially at the same or similar level with the second sacrificial layer 114B. The concentration of the counter-doped N-type impurity may be lower than the concentration of the P-type impurity in the second doped layer 132B. In this case, the concentration of the P-type impurity may decrease in the region L2 while the P type is maintained, thereby reducing the off-state current of a PMOS transistor. When the second sacrificial layer 114B is replaced with a gate electrode layer in a subsequent process, a metal-containing material having a relatively large work function, such as TaN or TiN, may be used as a gate electrode layer. Unlike the above-described embodiment of the present invention disclosure, since the concentration of the P-type impurity of the region L2 of the second doped layer 132B is relatively low, a separate process for forming a depletion region is not required.

The doping of an impurity for forming the region L2 may be performed using a tilt implantation method slanting toward a first side 111B of the second initial stacked structure 110B (refer to arrow ⑥). The angle of the tilt implantation may be smaller than the angle of the tilt implantation of FIGS. 6A and 6B and may be greater than the angle of the tilt implantation of FIGS. 9A and 9B based on a horizontal plane, for example, the surface of the substrate 100.

Since the subsequent processes are substantially the same as those described in the above-described embodiment of the present invention disclosure, detailed descriptions on them will be omitted.

Meanwhile, although the above embodiments are directed to a semiconductor device including a CMOS transistor and a method for fabricating the same, the present invention disclosure is not limited thereto. A semiconductor device including an NMOS transistor or a semiconductor device including a PMOS transistor may be fabricated according to an embodiment of the present invention disclosure. This will be described below with reference to FIGS. 17A and 17B.

Figure 17A:
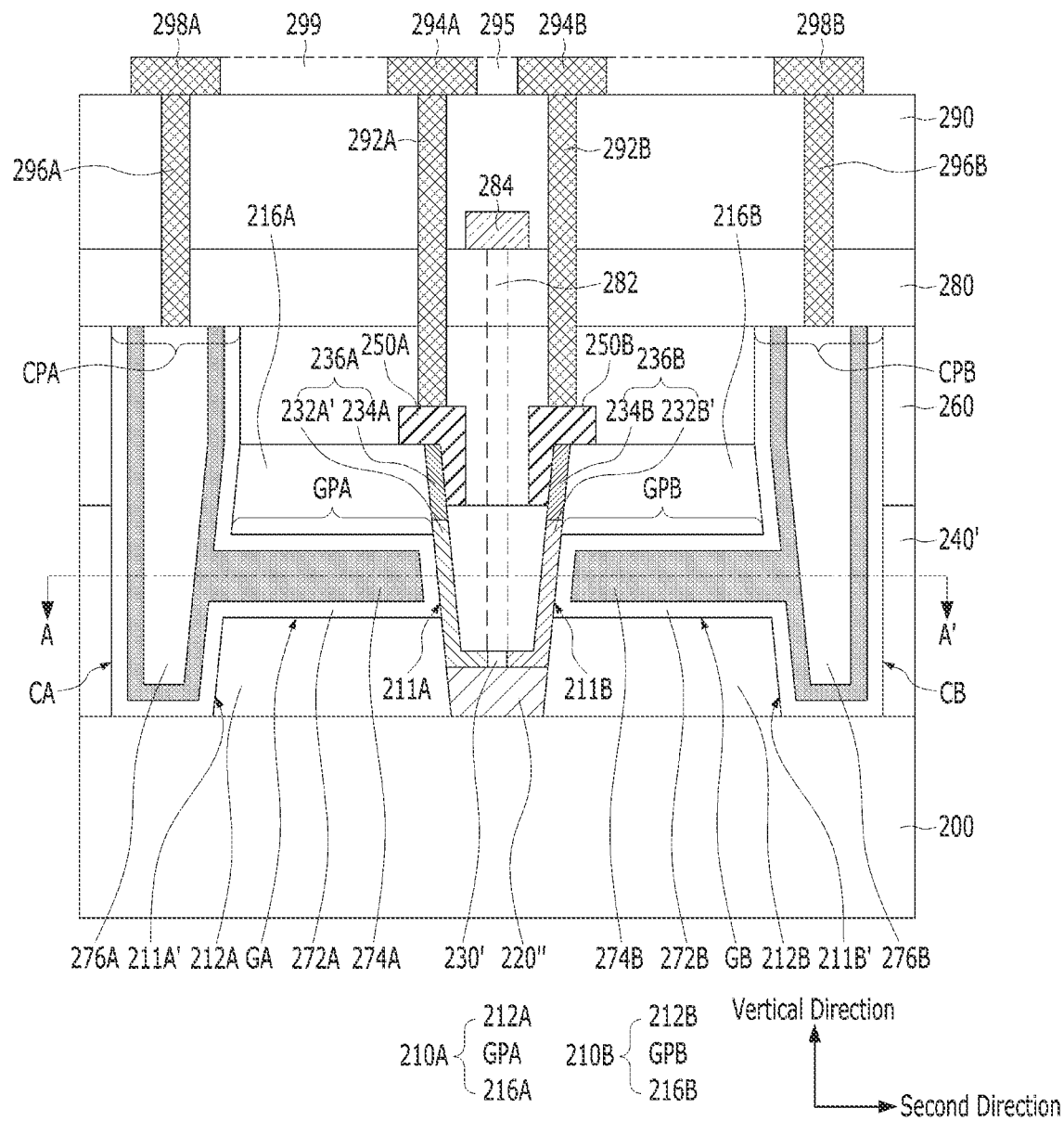
FIGS. 17A and 17B are views illustrating a semiconductor device and a method for fabricating the semiconductor device in accordance with another embodiment of the present invention disclosure.
Figure 17B:
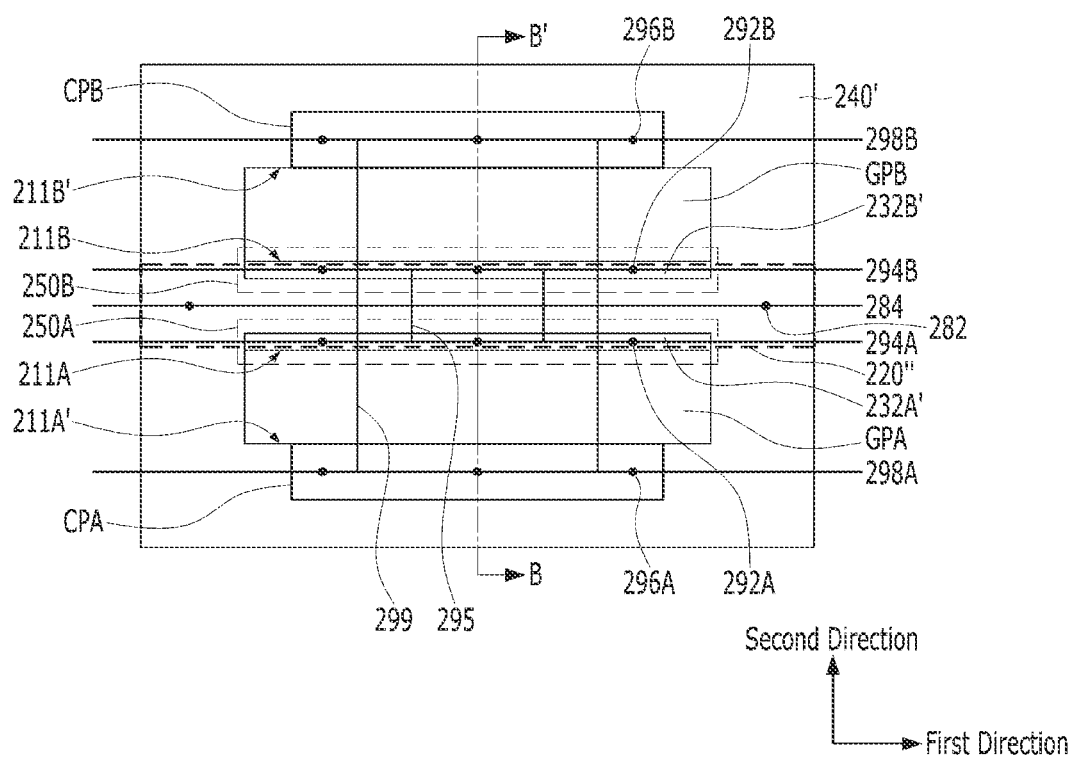

FIGS. 17A and 17B are views illustrating a semiconductor device and a method for fabricating the semiconductor device in accordance with another embodiment of the present invention disclosure. FIG. 17A is a cross-sectional view taken along a line B-B' of FIG. 17B, and FIG. 17B is a plan view illustrated at the height of a line A-A'. However, certain constituent elements that are not seen at the height of the line A-A' of FIG. 17A may be illustrated as dotted lines, solid lines or dots, etc., in FIG. 17B, or constituent elements that are not seen at the height of the line B-B' of FIG. 17B may be illustrated as dotted lines in FIG. 17A. Description will be made focusing on the differences from the above-described embodiments of the present invention disclosure.

Referring to FIGS. 17A and 17B, first and second stacked structures 210A and 210B may be formed over the substrate 200. The first stacked structure 210A may include a first lower dielectric layer 212A, a first horizontal gate structure GPA, and a first upper dielectric layer 216A that are stacked over the substrate 200 in the vertical direction. The second stacked structure 210B may include a second lower dielectric layer 212B, a second horizontal gate structure GPB, and a second upper dielectric layer 216B that are stacked over the substrate 200 in the vertical direction. A first side 211B of the second stacked structure 210B is facing a first side 211A of the first stacked structure 210A. The first horizontal gate structure GPA may include a first gate electrode layer 274A and a first gate dielectric layer 272A surrounding an upper surface and a lower surface of the first gate electrode layer 274A and a side facing the first side 211A. Also, the second horizontal gate structure GPB may include a second gate dielectric layer 274B, and a second gate dielectric layer 272B surrounding the upper surface and the lower surface of the second gate electrode layer 274B, and a side facing the first side 211B.

A lower electrode layer 220" may be disposed between the first stacked structure 210A and the second stacked structure 210B over the substrate 200. The lower electrode layer 220" may have an upper surface disposed at a height equal to or lower than the upper surface of the first and second lower dielectric layers 212A and 212B to be spaced apart from the first and second horizontal gate structures GPA and GPB, in particular, the first and second gate electrode layers 274A and 274B.

A first channel layer 236A and a second channel layer 236B may be formed over the first side 211A of the first stacked structure 210A and the first side 211B of the second stacked structure 210B, respectively. Also, a lower end of the first channel layer 236A and a lower end of the second channel layer 236B may be commonly coupled to the lower electrode layer 220".

Here, both of the first channel layer 236A and the second channel layer 236B may be doped with an impurity of the same conductivity type. For example, when the first and second channel layers 236A and 236B are doped with an N-type impurity, the first and second channel layers 236A and 236B may function as channels of an NMOS transistor. When the first channel layer 236A includes a first doped layer 232A' and a first additionally doped layer 234A and the second channel layer 236B includes a second doped layer 232B' and a second additionally doped layer 234B, all of the first doped layer 232A', the first additionally doped layer 234A, the second doped layer 232B', and the second additionally doped layer 234B may include an N-type impurity.

Alternatively, as another example, when the first and second channel layers 236A and 236B are doped with a P-type impurity, the first and second channel layers 236A and 236B may function as channels of a PMOS transistor. When the first channel layer 236A includes a first doped layer 232A' and a first additionally doped layer 234A, and the second channel layer 236B includes a second doped layer 232B' and a second additionally doped layer 234B, all of the first doped layer 232A', the first additionally doped layer 234A, the second doped layer 232B', and the second additionally doped layer 234B may include a P-type impurity. In this case, the first and second gate electrode layers 274A and 274B may be formed of a material having the same work function. An undoped material layer pattern 230' may exist between the lower end of the first channel layer 236A and the lower end of the second channel layer 236B.

First and second upper electrode layers 250A and 250B may be formed on the first and second channel layers 236A and 236B to contact and electrically connect to the first and second channel layers 236A and 236B. When there is a first inter-layer dielectric layer 240' whose upper surface is lower than the upper surfaces of the first channel layer 236A and the second channel layer 236B between the first channel layer 236A and the second channel layer 236B, the first upper electrode layer 250A may surround the upper surface and a portion of the side of the first channel layer 236A which protrudes above the first inter-layer dielectric layer 240', and the second upper electrode layer 250B may surround the upper surface and a portion of the side of the second channel layer 236B which protrudes above the first inter-layer dielectric layer 240'.

Also, a first vertical gate structure CPA extending in the vertical direction while being coupled to the first horizontal gate structure GPA on the second side 211A' which is positioned in opposite to the first side 211A of the first stacked structure 210A may be formed. Also, a second vertical gate structure CPB extending in the vertical direction while being coupled to the second horizontal gate structure GPB on the second side 211B' which is positioned in opposite to the first side 211B of the second stacked structure 210B may be formed over the substrate 200. The first vertical gate structure CPA may include a column-shaped first metal-containing layer 276A, a first gate electrode layer 274A that extends from the first horizontal gate structure GPA and surrounds the side and lower surface of the first metal-containing layer 276A, and a first gate dielectric layer 272A that extends from the first horizontal gate structure GPA and surrounds the side and lower surface of the first gate electrode layer 274A of the first vertical gate structure CPA. The second vertical gate structure CPB may include a column-shaped second metal-containing layer 276B, a second gate electrode layer 274B that extends from the second horizontal gate structure GPB and surrounds the side and lower surface of the second metal-containing layer 276B, and a second gate dielectric layer 272B that extends from the second horizontal gate structure GPB and surrounds the side and lower surface of the second gate electrode layer 274B of the second vertical gate structure CPB.

The lower electrode contact 282 may be formed to pass through the third inter-layer dielectric layer 280, the second inter-layer dielectric layer 260, and the first inter-layer dielectric layer 240' to be coupled to the lower electrode layer 220". The lower electrode line 284 may be formed to extend in the first direction while overlapping with and coupled to the lower electrode contact 282 over the third inter-layer dielectric layer 280.

The first and second upper electrode contacts 292A and 292B may be formed to pass through a fourth inter-layer dielectric layer 290, the third inter-layer dielectric layer 280, and the second inter-layer dielectric layer 260 to be coupled to the first and second upper electrode layers 250A and 250B, respectively, and the first and second upper electrode lines 294A and 294B may be formed to extend in the first direction while overlapping with and coupled to the first and second upper electrode contacts 292A and 292B, respectively, over the fourth inter-layer dielectric layer 290. In this case, the first upper electrode line 294A and the second upper electrode line 294B may be coupled to each other by a first coupling pattern 295. The first coupling pattern 295 may extend in the second direction at the same level of the first upper electrode line 294A and the second upper electrode line 294B and between the first upper electrode line 294A and the second upper electrode line 294B. The number of the first coupling patterns 295 may be diversely modified as long as the number is one or more.

The first and second gate contacts 296A and 296B may be formed to pass through the fourth inter-layer dielectric layer 290 and the third inter-layer dielectric layer 280 to be coupled to the first and second vertical gate structures CPA and CPB, respectively, and the first and second gate lines 298A and 298B may be formed to extend in the first direction while overlapping with and coupled to the first and second gate contacts 296A and 296B over the fourth inter-layer dielectric layer 290. In this case, the first gate line 298A and the second gate line 298B may be coupled to each other by a second coupling pattern 299. The second coupling pattern 299 may extend in the second direction at the same level of the first gate line 298A and the second gate line 298B and between the first gate line 298A and the second gate line 298B. The number of the second coupling patterns 299 may be diversely modified as long as the number is one or more. Furthermore, the second coupling pattern 299 may be formed at a position that does not overlap with the first coupling pattern 295.

Even in the case of this embodiment, substantially the same effects as those of the above-described embodiments may be obtained. In other words, it may be possible to reduce the size of a semiconductor device, reduce parasitic capacitance, and improve operation characteristics.

The embodiments described above may be applicable to all semiconductor devices including an NMOS transistor, a PMOS transistor, or a CMOS transistor, and a method for fabricating the same. For example, the above-described embodiments may also be applied to diverse semiconductor devices, which include non-volatile memories such as a flash memory, a Resistive Random-Access Memory (RRAM), a Phase-change Random-Access Memory (PRAM), and a Magneto-resistive Random-Access Memory (MRAM), volatile memories such as a Dynamic Random-Access Memory (DRAM) and a Static Random-Access Memory (SRAM), non-memories such as logic circuits, and CIS (CMOS Image Sensor).

According to an embodiment of the present invention disclosure, disclosed are a semiconductor device having reduced parasitic capacitance and improved operation characteristics while having a reduced size of the semiconductor device, and a method for fabricating the semiconductor device.

While the present invention disclosure has been described with respect to specific embodiments, it will be apparent to those skilled in the art that various changes and modifications may be made without departing from the spirit and scope of the present invention disclosure as defined in the following claims.

What is claimed is:

1. A semiconductor device, comprising:
   a first stacked structure including a first lower dielectric layer, a first horizontal gate structure, and a first upper dielectric layer that are stacked in a vertical direction;
   a second stacked structure including a second lower dielectric layer, a second horizontal gate structure, and a second upper dielectric layer that are stacked in the vertical direction, and having a first side which faces a first side of the first stacked structure;
   a first channel layer formed on an upper portion of the first side of the first stacked structure;
   a second channel layer formed on an upper portion of the first side of the second stacked structure;
   a lower electrode layer commonly coupled to lower ends of the first and second channel layers between the first stacked structure and the second stacked structure, the lower electrode layer having a first sidewall contacting a lower portion of the first side of the first stacked structure and a second sidewall contacting a lower portion of the first side of the second stacked structure;
   a first upper electrode layer coupled to an upper end of the first channel layer; and
   a second upper electrode layer coupled to an upper end of the second channel layer.

2. The semiconductor device of claim 1, wherein the first channel layer includes an impurity of a first conductivity type, and
   the second channel layer includes an impurity of a second conductivity type which is different from the first conductivity type.

3. The semiconductor device of claim 1, wherein the first channel layer and the second channel layer include an impurity of the same conductivity type.

4. The semiconductor device of claim 1, wherein the first channel layer includes a first doped layer and a first additionally doped layer over the first doped layer, and a concentration of an impurity of the first additionally doped layer is greater than a concentration of an impurity of the first doped layer, and
   the second channel layer includes a second doped layer and a second additionally doped layer over the second doped layer, and a concentration of an impurity of the second additionally doped layer is greater than a concentration of an impurity of the second doped layer.

5. The semiconductor device of claim 4, wherein the first upper electrode layer is in contact with the first additionally doped layer, and
   the second upper electrode layer is in contact with the second additionally doped layer.

6. The semiconductor device of claim 1, further comprising:
   a dielectric layer having an upper surface positioned at a height lower than an upper surface of the first channel layer and an upper surface of the second channel layer while filling a space between the first channel layer and the second channel layer, and
   wherein the first upper electrode layer surrounds the upper surface and a portion of a side of the first channel layer protruding from the dielectric layer, and
   the second upper electrode layer surrounds the upper surface and a portion of a side of the second channel layer protruding from the dielectric layer.

7. The semiconductor device of claim 1, wherein an upper surface of the lower electrode layer is positioned at a height equal to or lower than upper surfaces of the first and second lower dielectric layers.

8. The semiconductor device of claim 1, further comprising:
a first vertical gate structure extending in the vertical direction while being coupled to the first horizontal gate structure on a second side of the first stacked structure; and
a second vertical gate structure extending in the vertical direction while being coupled to the second horizontal gate structure on a second side of the second stacked structure.

9. The semiconductor device of claim 1, wherein the first horizontal gate structure includes a first gate electrode layer, and a first gate dielectric layer surrounding an upper surface, a lower surface, and a side of the first gate electrode layer, the side of the first gate electrode layer facing the first side of the first stacked structure, and
the second horizontal gate structure includes a second gate electrode layer, and a second gate dielectric layer surrounding an upper surface, a lower surface, and a side of the second gate electrode layer, the side of the second gate electrode layer facing the first side of the second stacked structure.

10. The semiconductor device of claim 9, further comprising:
a first vertical gate structure including a first metal-containing layer that extends in the vertical direction while being coupled to the first horizontal gate structure on the second side of the first stacked structure; and
a second vertical gate structure including a second metal-containing layer that extends in the vertical direction while being coupled to the second horizontal gate structure on the second side of the second stacked structure,
wherein the first gate electrode layer further extends to surround side and lower surfaces of the first metal-containing layer,
the first gate dielectric layer further extends to surround side and lower surfaces of the further extended first gate electrode layer,
the second gate electrode layer further extends to surround side and lower surfaces of the second metal-containing layer, and
the second gate dielectric layer further extends to surround side and lower surfaces of the further extended second gate electrode layer.

11. The semiconductor device of claim 10, wherein the first metal-containing layer has a lower resistance than the first gate electrode layer, and
the second metal-containing layer has a lower resistance than the second gate electrode layer.

12. The semiconductor device of claim 8, further comprising:
a lower electrode contact and a lower electrode line coupled to the lower electrode layer over the lower electrode layer;
a first upper electrode contact and a first upper electrode line coupled to the first upper electrode layer over the first upper electrode layer;
a second upper electrode contact and a second upper electrode line coupled to the second upper electrode layer over the second upper electrode layer;
a first gate contact and a first gate line coupled to the first vertical gate structure over the first vertical gate structure; and
a second gate contact and a second gate line coupled to the second vertical gate structure over the second vertical gate structure.

13. The semiconductor device of claim 12, wherein the first sides of the first and second stacked structures extend in a first direction,
the lower electrode layer extends in the first direction, and
the lower electrode contact is positioned outside a space between the first stacked structure and the second stacked structure in the first direction.

14. The semiconductor device of claim 12, wherein the first sides of the first and second stacked structures extend in a first direction, and
the lower electrode line, the first and second upper electrode lines, and the first and second gate lines extend in the first direction.

15. The semiconductor device of claim 12, wherein the lower electrode line is positioned at a lower height than the first and second upper electrode lines and the first and second gate lines.

16. The semiconductor device of claim 12, wherein the first and second upper electrode lines, and the first and second gate lines are positioned at the same height.

17. The semiconductor device of claim 12, wherein when the first channel layer and the second channel layer include impurities of the same conductivity type,
the first upper electrode line and the second upper electrode line are electrically connected to each other, and
the first gate line and the second gate line are electrically connected to each other.

18. The semiconductor device of claim 17, wherein the first sides of the first and second stacked structures extend in a first direction, and
the first and second upper electrode lines, and the first and second gate lines extend in the first direction, and
further comprising:
a first coupling pattern that extends in a second direction crossing the first direction between the first upper electrode line and the second upper electrode line and couples the first upper electrode line and the second upper electrode line to each other; and
a second coupling pattern that extends in the second direction between the first gate line and the second gate line and couples the first gate line and the second gate line to each other.

19. The semiconductor device of claim 1, wherein the first sides of the first and second stacked structures extend in a first direction, and
each of the first and second channel layers has a longer length in the first direction than a length in a second direction crossing the first direction.

20. The semiconductor device of claim 2, wherein a work function of the first horizontal gate structure and a work function of the second horizontal gate structure are different from each other.

* * * * *